1

(12) United States Patent
Zierath et al.

(10) Patent No.: US 11,018,054 B2
(45) Date of Patent: May 25, 2021

(54) INTEGRATED CIRCUIT INTERCONNECTS

(71) Applicant: Intel Corporation, Santa Clara, CA (US)

(72) Inventors: Daniel J. Zierath, Portland, OR (US); Flavio Griggio, Portland, OR (US); John D. Brooks, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/486,612

(22) PCT Filed: Apr. 12, 2017

(86) PCT No.: PCT/US2017/027108
§ 371 (c)(1),
(2) Date: Aug. 16, 2019

(87) PCT Pub. No.: WO2018/190817
PCT Pub. Date: Oct. 18, 2018

(65) Prior Publication Data
US 2020/0013673 A1 Jan. 9, 2020

(51) Int. Cl.
H01L 21/76 (2006.01)
H01L 27/06 (2006.01)
H01L 21/768 (2006.01)
H01L 21/321 (2006.01)
H01L 23/532 (2006.01)

(52) U.S. Cl.
CPC .... H01L 21/76877 (2013.01); H01L 21/3212 (2013.01); H01L 21/76858 (2013.01); H01L 23/53209 (2013.01); H01L 27/0617 (2013.01)

(58) Field of Classification Search
CPC ........... H01L 21/76877; H01L 21/3212; H01L 21/76858; H01L 23/53209; H01L 27/0617
See application file for complete search history.

(56) References Cited

U.S. PATENT DOCUMENTS

| 7,189,650 B2 | 3/2007 | Liu et al. |
| 2006/0246725 A1 | 11/2006 | Yeoh |
| 2009/0197408 A1 | 8/2009 | Lehr et al. |

FOREIGN PATENT DOCUMENTS

| JP | 200357979 | * | 9/2003 |
| JP | 2003257979 A | | 9/2003 |
| KR | 1020050009616 | * | 1/2005 |
| KR | 20110001894 | | 1/2011 |
| WO | 2018190817 A1 | | 10/2018 |

OTHER PUBLICATIONS

Gutmann et al "Integration of copper multilevel interconnects with oxide and polymer interlevel dielectrics," Thin Solind Films 270 (1995) 472 (Year: 1995).*
International Search Report and Written Opinion in International Patent Application No. PCT/US2017/027108 dated Jan. 31, 2018, 12 pages.

* cited by examiner

Primary Examiner — Matthew L Reames
(74) Attorney, Agent, or Firm — Patent Capital Group

(57) ABSTRACT

Disclosed herein are integrated circuit (IC) interconnects, as well as related devices and methods. For example, in some embodiments, an interconnect may include a first material and a second material distributed in the first material. A concentration of the second material may be greater proximate to the top surface than proximate to the bottom surface.

19 Claims, 18 Drawing Sheets

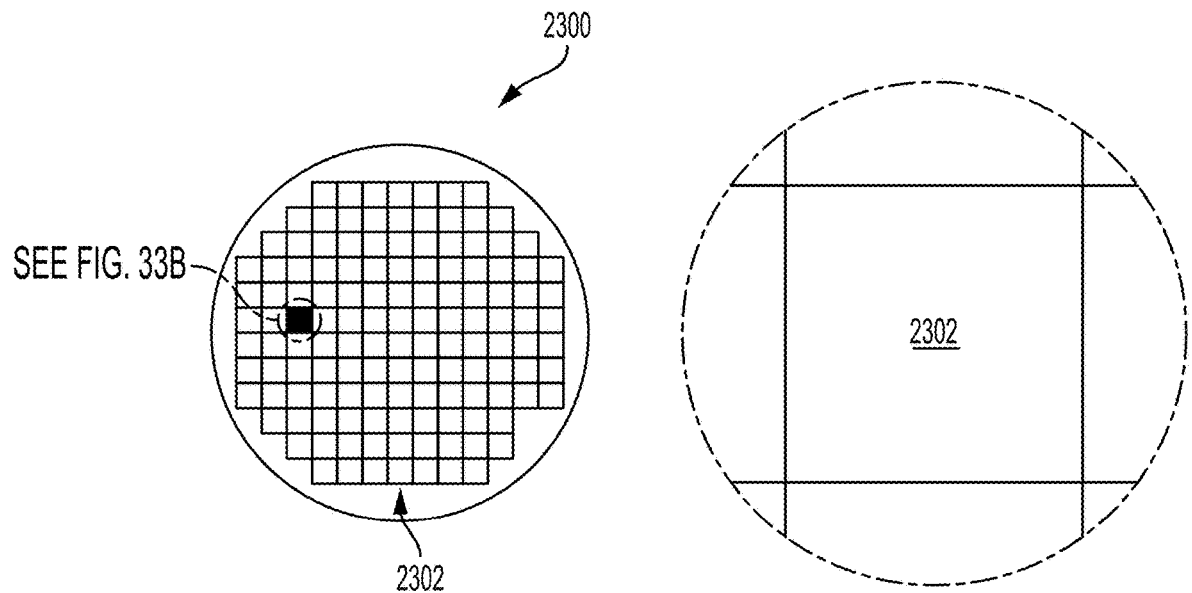
FIG. 33A   FIG. 33B
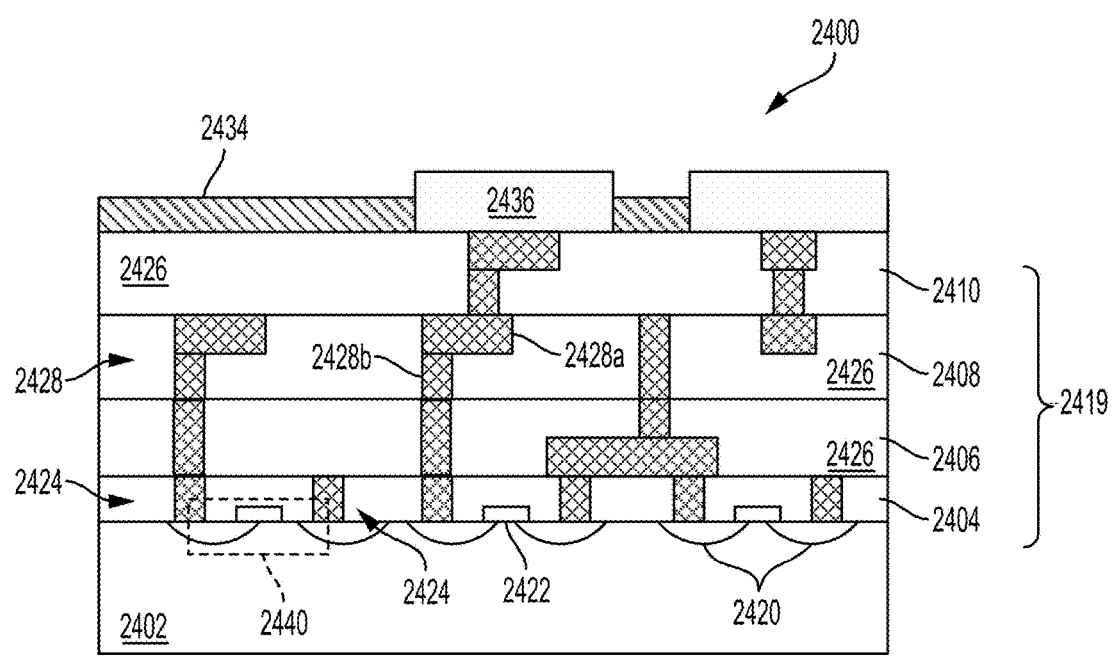
FIG. 34

INTEGRATED CIRCUIT INTERCONNECTS

CROSS-REFERENCE TO RELATED APPLICATION

This application is a national stage application under 35 U.S.C. § 371 of PCT International Application Serial No. PCT/US2017/027108, filed on Apr. 12, 2017 and entitled "INTEGRATED CIRCUIT INTERCONNECTS," which is hereby incorporated by reference in its entirety.

BACKGROUND

Integrated circuit (IC) devices typically include conductive interconnects to provide electrical pathways between different elements (e.g., transistors, pads, passive components, etc.).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 33A and 33B are top views of a wafer and dies that may include an interconnect in accordance with any of the embodiments disclosed herein.

FIG. 34 is a cross-sectional side view of an IC device that may include an interconnect in accordance with any of the embodiments disclosed herein.

DETAILED DESCRIPTION

Disclosed herein are integrated circuit (IC) interconnects, as well as related devices and methods. For example, in some embodiments, an interconnect may include a first material (e.g., a metal) and a second material distributed in the first material. A concentration of the second material may be greater proximate to the top surface than proximate to the bottom surface.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

Figure 1:
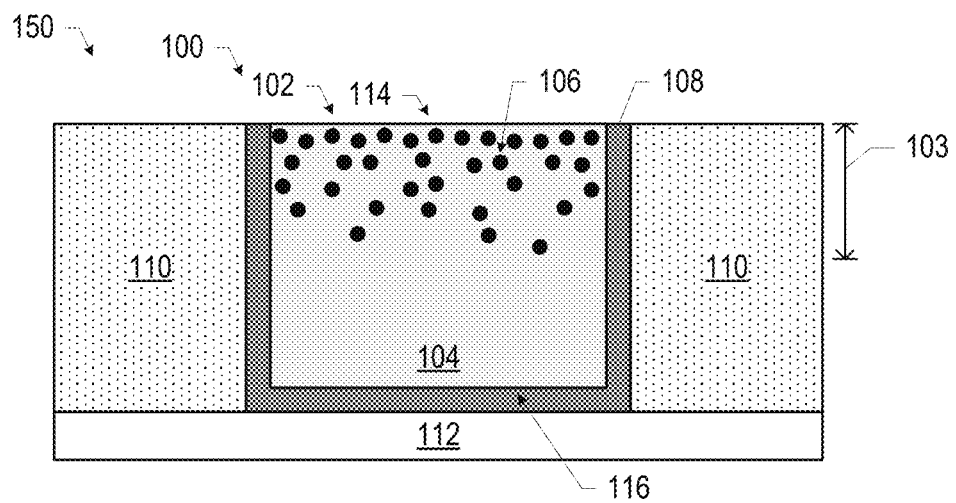
FIG. 1 is a cross-sectional view of an integrated circuit (IC) device including an interconnect, in accordance with various embodiments.

FIG. 1 is a cross-sectional view of a portion of an IC device 150 including an interconnect 100. The interconnect 100 may provide an electrical pathway between an IC structure 112 and another element "above" the interconnect 100 (not shown). In some embodiments, the interconnect 100 may be a conductive via, a conductive line, or any other conductive structure; examples of such embodiments are discussed below with reference to FIGS. 4-31. The IC structure 112 may include any IC components, such as another interconnect (another interconnect 100, or a conventional conductive structure) or a passive or active electrical component (e.g., a transistor, a resistor, a capacitor, a memory cell, or any other component).

The interconnect 100 may be surrounded by a layer of insulating material 110. The insulating material 110 may include any suitable material, such as any suitable oxide or nitride. In some embodiments, the insulating material 110 may be an interlayer dielectric (ILD). The interconnect 100 may include a liner material 108 that may be disposed on side walls of the insulating material 110 and on an exposed portion of the IC structure 112, as shown in FIG. 1. As discussed below with reference to FIG. 7, in some embodiments, the liner material 108 may be conformally deposited in a recess in the insulating material 110. In some embodiments, the liner material 108 may serve as an adhesion liner, and may serve to improve the mechanical adhesion between the conductive material 102 (discussed further below) of the interconnect 100 and the insulating material 110/IC structure 112. In some embodiments, the liner material 108 may serve as a barrier against metal diffusion from the first material 104 into the insulating material 110. In some embodiments, the liner material 108 may serve to reduce electromigration between the first material 104 and the IC structure 112. In some embodiments, the liner material 108 may include copper doped with aluminum, or copper doped with manganese (e.g., to reduce electromigration). In some embodiments, the liner material 108 may include a refractory metal or a refractory metal nitride, such as titanium, tantalum, titanium nitride, titanium zirconium nitride, ruthenium, doped ruthenium (e.g., ruthenium doped with phosphorus) or tantalum nitride. In some embodiments, the liner material 108 may include tantalum nitride/tantalum (TNT). In some embodiments, the liner material 108 may include titanium nitride, which may have any suitable thickness (e.g., between 2 and 70 Angstroms).

As noted above, the interconnect 100 may also include a conductive material 102. The liner material 108 may be disposed between the conductive material 102 and the insulating material 110/IC structure 112. The conductive material 102 may have a top surface 114 and a bottom surface 116; as illustrated in FIG. 1, a portion of the liner material 108 may be disposed between the bottom surface 116 and the IC structure 112.

The conductive material 102 may include a first material 104 and a second material 106. The second material 106 may be present in the first material 104 with a concentration gradient so that the concentration of the second material 106 generally decreases in the direction from the top surface 114 to the bottom surface 116. The concentration gradient of the second material 106 may, in some embodiments, be substantially monotonically decreasing from the top surface 114 to the bottom surface 116. In some embodiments, none of the second material 106 may be present in the first material 104 at a depth greater than a depth 103. In some embodiments, the depth 103 may be at least 1 nanometer. In some embodiments, the depth 103 may be the full depth of the first material 104. The depth 103 may be controlled by the process used to form the conductive material 102, as discussed in further detail herein.

In some embodiments, the first material 104 may include any suitable conductive material, including, but not limited to, metals or combinations of metals. For example, in some embodiments, the first material 104 may include cobalt, copper, tungsten, aluminum, titanium, ruthenium, nickel, platinum, palladium, rhodium, rhenium, iridium, or any combination of such metals. In some embodiments, the first material 104 may be a superconductor, such as aluminum, tin, titanium nitride, niobium titanium nitride, tantalum, niobium, and other niobium compounds (e.g., niobium tin and niobium germanium).

The second material 106 may include any material that may disrupt the microstructure of the first material 104 in a desired manner. In some embodiments, the second material 106 may be a metal (e.g., any of the metals discussed above with reference to the first material 104), but may be a different metal from the first material 104; such embodiments may be particularly useful when the conductive material 102 is to have a large grain microstructure near the top surface 114, as discussed below with reference to FIG. 2. In some embodiments, the second material 106 may include silicon, boron, phosphorus; such embodiments may be particularly useful when the conductive material 102 is to have a small grain microstructure near the top surface 114, as discussed below with reference to FIG. 3. In some embodiments, the second material 106 may disrupt the microstructure of the first material 104 so that the conductive material 102 has an amorphous microstructure near the top surface 114 (e.g., with a polycrystalline or other microstructure away from the top surface 114).

The second material 106 may be included in the conductive material 102 in any suitable manner. In some embodiments, the first material 104 may be deposited and then doped with the second material 106. The first material 104/second material 106 may be annealed subsequent to or prior to doping, and then may be polished back to a desired height. In some embodiments, the second material 106 may be deposited on the first material 104 as a thin film, then baked to diffuse the second material 106 into the first material 104. A number of techniques for forming the interconnect 100 are discussed below with reference to FIGS. 4-31.

In some embodiments, the presence of the second material 106 proximate to the top surface 114 of the conductive material 102 may result in different microstructures of the conductive material 102 proximate to the top surface 114 and proximate to the bottom surface 116. For example, in some embodiments, the conductive material 102 may be formed substantially of the first material 104 proximate to the bottom surface 116, and may have a crystalline or polycrystalline microstructure associated with the first material 104. Proximate to the top surface 114, the conductive material 102 may include both the first material 104 and the second material 106, and may have a different microstructure from the microstructure proximate to the bottom surface 116.

Figure 2:
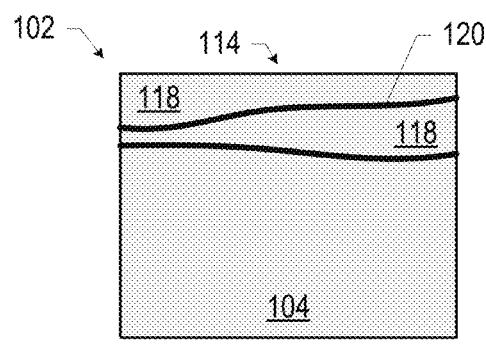
FIGS. 2 and 3 are detailed views of example microstructures of the conductive material of various embodiments of the interconnect of FIG. 1.
Figure 3:
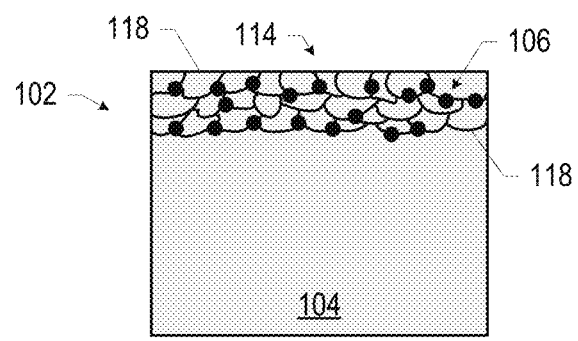

FIGS. 2 and 3 are detailed views of example microstructures of the conductive material 102 of various embodiments of the interconnect 100 of FIG. 1. FIG. 2 depicts an embodiment of the conductive material 102 in which the second material 106 has been added to the first material 104 proximate to the top surface 114 in an amount beyond the solubility limit and baked, causing large grains 118 of the first material 104 to form proximate to the top surface 114. These large grains 118 may form as a small grain metal system (including, e.g., Cu—Co, Al—Ti, Co—Al—W alloys, depending upon the first material 104 and the second material 106) evolves into a large grain system because of the coupling of solute precipitation with grain growth. When the second material 106 is a metal different from the first material 104, the second material 106 and the first material 104 may react to form an intermetallic compound 120 that may be present at the boundaries of the large grains 118, as illustrated in FIG. 2.

FIG. 3 depicts an embodiment of the conductive material 102 in which the second material 106 has been added to the first material 104 proximate to the top surface 114 so as to prevent the formation of large grains of the first material 104 and instead keep the grains 118 of the first material 104 small. The second material 106 may segregate itself along the grain boundaries, as suggested in FIG. 3. In some embodiments, the microstructure of the first material 104 proximate to the top surface 114 may be more amorphous than polycrystalline.

Including the second material 106 in the first material 104 of the conductive material 102 of the interconnect 100 may improve the manufacturability and reliability of the IC device 150 relative to some conventional interconnects. In particular, the interconnects 100 disclosed herein may be more reliably and precisely planarized (e.g., by chemical mechanical polishing (CMP)) than conventional interconnects. In some conventional interconnects, the sizes of the grains of the metal fill may be widely distributed, with some small and some large. The orientation and phase of grains 118 may also differ. When such a conventional interconnect is planarized, the inhomogeneous grain distribution may result in local polishing at different rates, resulting in an uneven top surface of a single interconnect and/or different heights for different interconnects. Such an uneven top surface may result in an "open contact" when the interconnect is not "tall" enough to reach a target location where it will contact another element, or a "short" when the interconnect is too "tall" and inadvertently bridges multiple elements.

By contrast, use of various ones of the interconnects 100 disclosed herein may improve the mechanical properties of the interconnects 100 near the top surface 114 for effective planarization. For example, when the grains 118 of the first material 104 are large (as discussed above with reference to FIG. 2), and the interconnect 100 is planarized, the large size of the grains 118 may mean that only a single large grain 118 (or small number of large grains 118) of each single interconnect 100 is in contact with the polishing pad at a time. The rate of polishing may thus be more uniform within an interconnect 100, and across multiple interconnects 100, than with conventional interconnects. In another example, when the grains 118 of the first material 104 are small (as discussed above with reference to FIG. 3), and the interconnect 100 is planarized, the polishing pad may be in contact with a substantially uniform distribution of small grains 118 within each interconnect 100. The rate of polishing may thus be more uniform within an interconnect 100, and across multiple interconnects 100, than with conventional interconnects. In another example, when the conductive material 102 is amorphous near the top surface 114 (and, e.g., polycrystalline elsewhere), the rate of polishing may be more uniform within an interconnect 100, and across multiple interconnects 100, than with conventional interconnects.

As interconnects 100 become smaller, specific microstructural features like the distribution of the grain 118 may be more relevant to performance and reliability than bulk properties of the conductive material 102. In some embodiments, changing the microstructure of the conductive material 102 at the top surface 114 to improve planarization may come at the cost of decreased electrical performance. For example, when the second material 106 has a lower electrical conductivity than the first material 104, the conductive material 102 may have a higher resistance than it would have if the second material 106 were not present. However, the performance improvements achieved by reliable planarization may outweigh this increased bulk resistance, especially when the interconnects 100 are small. Additionally, in some embodiments, the second material 106 may be located proximate to the top surface 114 where the second material 106 may cause a distribution of grains 118 that is advantageous for planarization, but not elsewhere in the first material 104 to limit its potentially negative effects on bulk conductivity.

In some embodiments, the change in microstructure of the conductive material 102 at the top surface 114 may improve bulk electrical properties of the conductive material 102. For example, if the first material 104 has improved conductivity in a desired direction when its grains are arranged in a desired crystallographic orientation, the second material 106 may be deposited with its grains in a "template" crystallographic orientation that, upon heating, diffuses the second material into the first material 104 and induces the grains of the first material 104 to orient themselves in accordance with the "template" provided by the second material 106 and achieve the desired crystallographic orientation. The improved conductivity in the desired direction (e.g., "vertically" when the interconnect 100 is a conductive via) may reduce unwanted electromigration in other directions.

The interconnects 100 disclosed herein may be included in an IC device in any of a number of ways. FIGS. 4-31 illustrate various example stages in the formation of interconnects 100 in an IC device 150, in accordance with various embodiments. In particular, FIGS. 4-31 illustrate the use of the techniques disclosed herein to form conductive vias and conductive lines. In some IC devices 150, all of the interconnects may be embodiments of the interconnects 100 disclosed herein; in other IC devices 150, only a subset of the interconnects may be embodiments of the interconnects 100 disclosed herein, while others of the interconnects may be conventional. In some IC devices 150, all or some of the conductive vias may be embodiments of the interconnects 100 disclosed herein, while the conductive lines may be conventional (or vice versa). Although FIGS. 4-31 explicitly depict the formation of a particular arrangement of conductive vias and lines, this is simply for ease of illustration, and the interconnects 100 may implemented in any arrangement.

Figure 4:
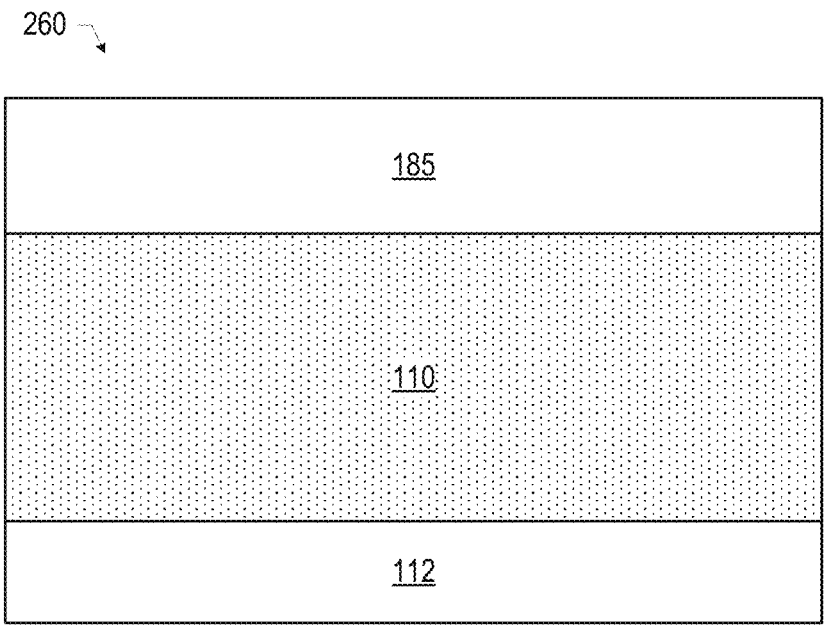
FIGS. 4-26 illustrate various example stages in the formation of interconnects in an IC device, in accordance with various embodiments.

FIG. 4 is a cross-sectional view of an assembly 260 including an IC structure 112, an insulating material 110 on the IC structure 112, and a resist material 185 on the insulating material 110. The IC structure 112 and the insulating material 110 may take any of the forms disclosed herein. The resist material 185 may be any suitable resist for patterning the insulating material 110, as discussed below with reference to FIG. 6 (e.g., a photoresist).

Figure 5:
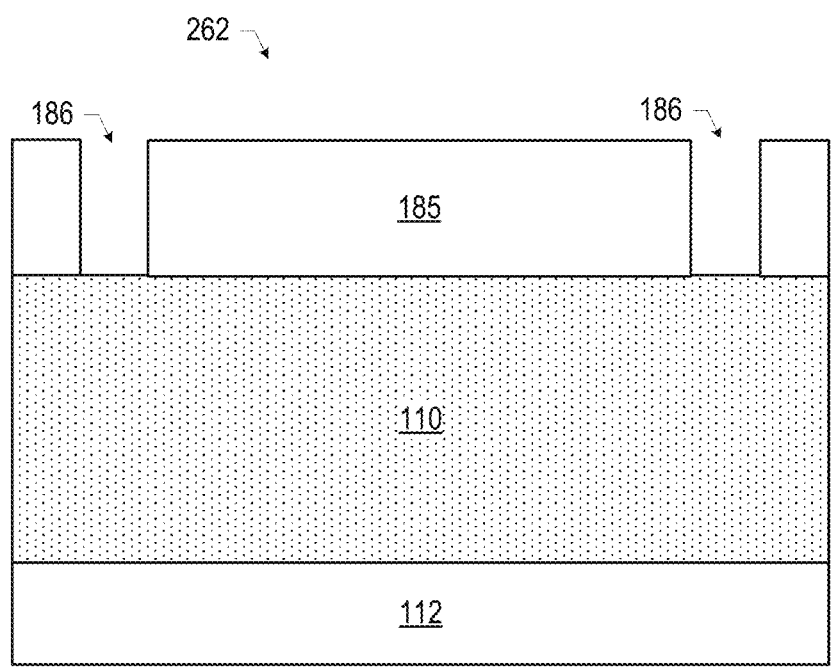

FIG. 5 is a cross-sectional view of an assembly 262 subsequent to patterning the resist material 185 of the assembly 260 (FIG. 4). The patterned resist material 185 may include openings 186 that extend down to and expose portions of the insulating material 110. The patterning of the resist material 185 may be performed in accordance with any suitable technique (e.g., a photolithography technique).

Figure 6:
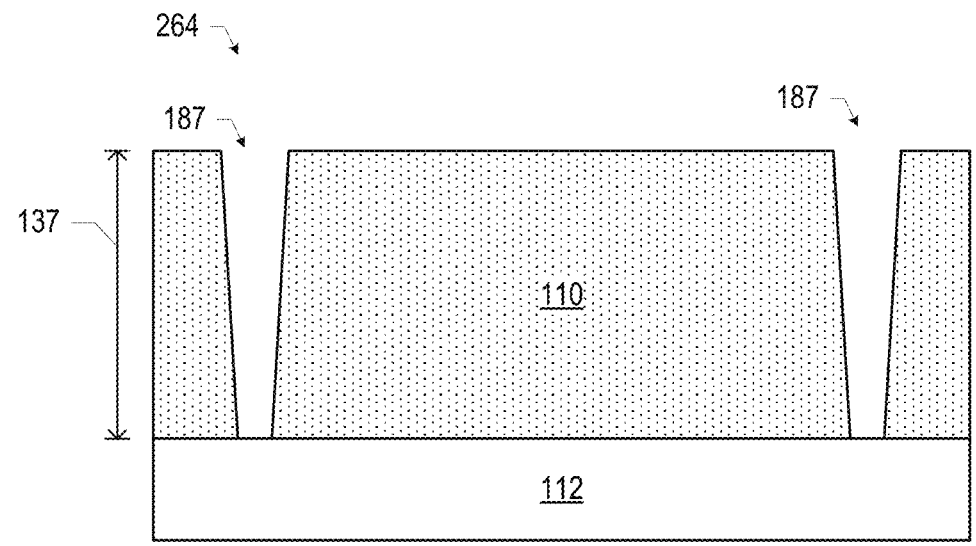

FIG. 6 is a cross-sectional view of an assembly 264 subsequent to etching the insulating material 110 in accordance with the pattern provided by the patterned resist material 185 of the assembly 262 (FIG. 5), and removing the remaining resist material 185. In particular, trenches 187 may be formed in the insulating material 110 at locations corresponding to the locations of the openings 186 in the resist material 185. The trenches 187 may extend down to the IC structure 112. In some embodiments, the trenches 187 may have a taper, and may be narrower closer to the IC structure 112, as illustrated. The trenches 187 may have any suitable dimensions; for example, in some embodiments, the trenches 187 may have a depth 137 less than or equal to 100 nanometers.

Figure 7:
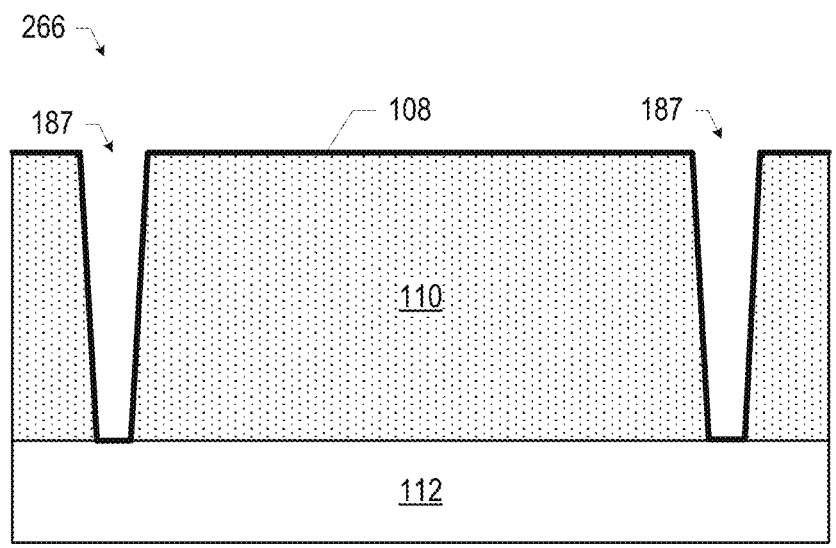

FIG. 7 is a cross-sectional view of an assembly 266 subsequent to providing a liner material 108 on the assembly 264 (FIG. 6). In particular, the liner material 108 may be provided on the exposed insulating material 110, as well as at the bottom of the trenches 187 (in FIG. 7, on the exposed IC structure 112). The liner material 108 may take any of the forms disclosed herein, and may be provided using any suitable technique, such as atomic layer deposition (ALD).

Figure 8:
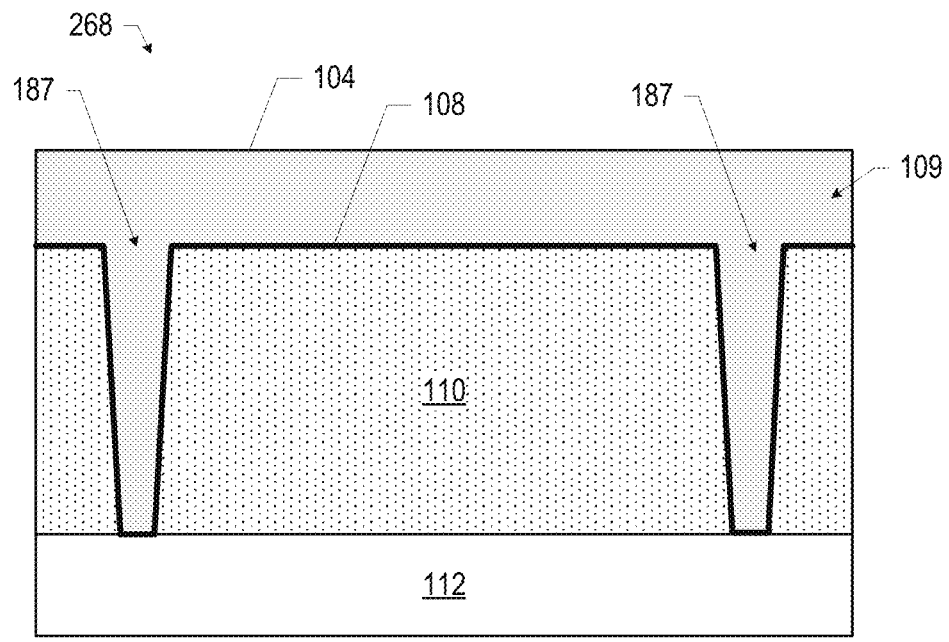

FIG. 8 is a cross-sectional view of an assembly 268 subsequent to providing a first material 104 on the assembly 266 (FIG. 7) such that the first material 104 fills the trenches 187. Any suitable technique may be used to provide the first material 104 on the assembly 266 (e.g., sputtering). The first material 104 may be in contact with the liner material 108. In some embodiments (e.g., as illustrated in FIG. 8), the first material 104 may extend beyond the trenches 187 over the insulating material 110; this "extra" first material 104 may be referred to herein as the overburden 109. The first material 104 may take any of the forms disclosed herein. For example, in some embodiments, the first material 104 may be copper. In some embodiments, the first material 104 may be tungsten (and may be deposited by chemical vapor deposition (CVD), for example).

Figure 9:
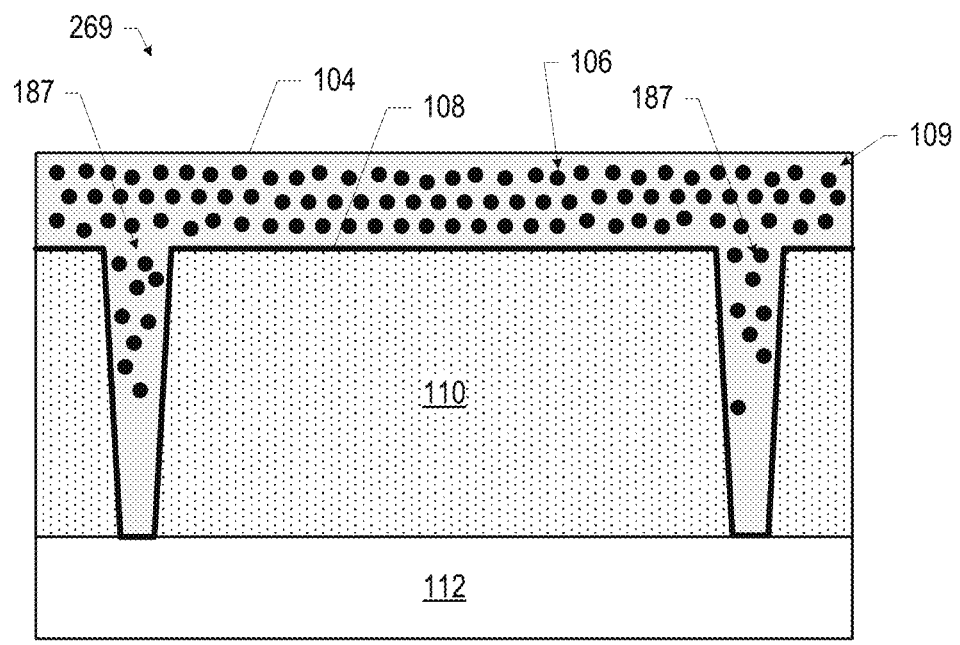

FIG. 9 is a cross-sectional view of an assembly 269 subsequent to providing a second material 106 to the first material 104 of the assembly 268 (FIG. 8). The concentration of the second material 106 in the first material 104 may be greatest in the overburden 109, and may decrease within the first material 104 in the trenches 187. The second material 106 may take any of the forms disclosed herein. In some embodiments, the provision of the second material 106 into the first material 104 may be performed by doping. The doping conditions may be controlled to achieve a desired depth of doping and gradient of doping. In some embodiments, the first material 104 may be doped with the second material 106 using an ion implantation technique or a diffusion technique. When ion implantation is used, the first material 104 may be bombarded with the second material 106 under an electrical bias; the surface of the first material 104 may be mechanically damaged and the second material 106 may penetrate anisotropically into the first material 104. When diffusion is used, the first material 104 may be contacted by a gas that includes the second material 106 so that the second material 106 diffuses into the first material 104 without the additional kinetic energy imparted during ion implantation; the depth of diffusion may be a characteristic of the first material 104 and the second material 106. In some embodiments, the assembly 269 may be annealed before or after doping. In some embodiments, the provision of the second material 106 into the first material 104 may be performed by thin film deposition of the second material 106 (e.g., with a desired crystallographic orientation, as discussed above), an anneal to drive the second material 106 into the first material 104, and removal of the thin film layer of the second material 106 by planarization or etch. In some embodiments, the assembly 268 may be planarized to a small degree prior to providing the second material 106 to form the assembly 269.

Figure 10:
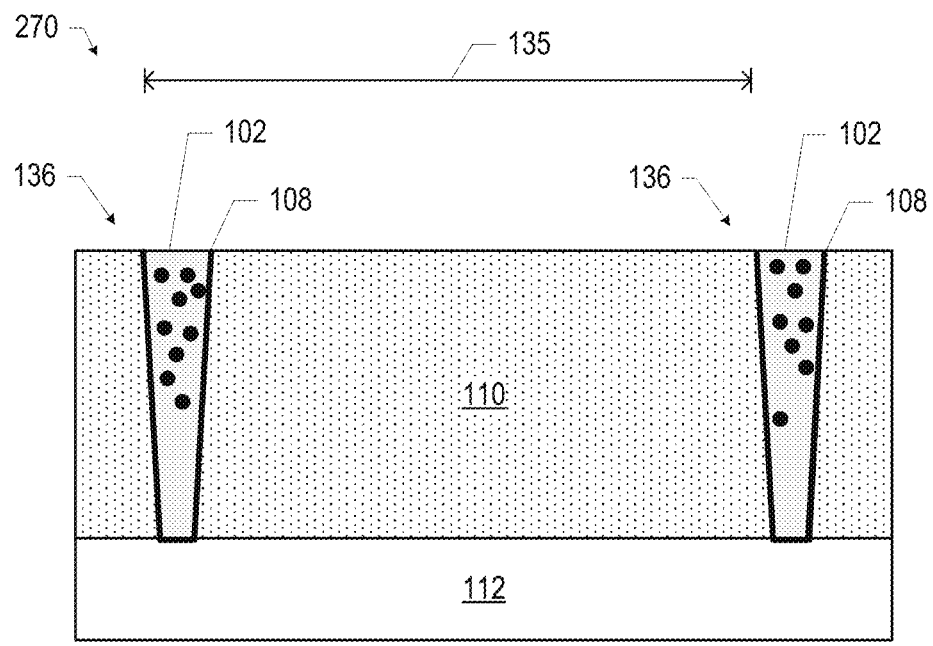

FIG. 10 is a cross-sectional view of an assembly 270 subsequent to planarizing the assembly 269 (FIG. 9) to remove the overburden 109. As noted above, the planarization may be performed by a CMP technique. The remaining first material 104 in the trenches 187 (and the liner material 108 in the trenches 187) may provide conductive vias 136; the conductive vias 136 are an embodiment of the interconnects 100 disclosed herein. In particular, the conductive vias 136 may include some of the second material 106 at their top surface (to control the grain structure at the top surface for planarization, as discussed above) and the concentration of that second material 106 may decrease toward the bottom surface of the conductive vias 136. The conductive vias 136 may have any desired width, depth, and pitch; for example, the pitch 135 may be less than 130 nanometers, in some embodiments.

Figure 11:
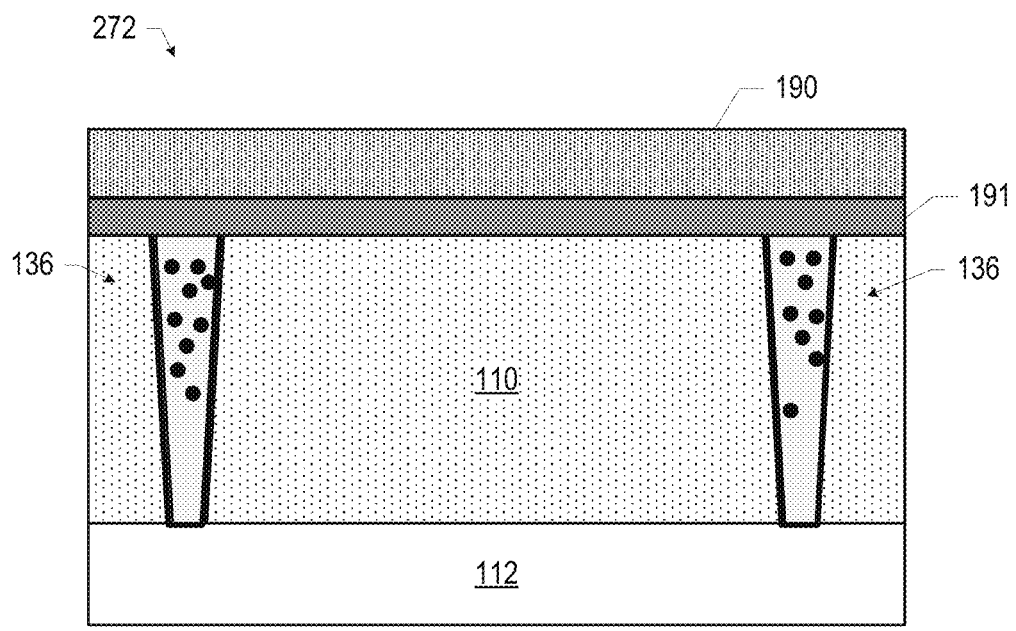

FIG. 11 is a cross-sectional view of an assembly 272 subsequent to depositing an etch stop material 191 and an insulating material 190 on the assembly 270 (FIG. 10). The etch stop material 191 may be disposed between the insulating material 190 and the assembly 270, as shown. The etch stop material 191 may include any suitable material, such as a nitride, silicon carbide, silicon nitride, carbon-doped silicon nitride, or silicon oxycarbide. In some embodiments, the etch stop material 191 may be deposited using CVD. The etch stop material 191 may have any suitable thickness. In some embodiments, the etch stop material 191 may have a thickness that is less than 20 nanometers (e.g., between 8 nanometers and 12 nanometers). The insulating material 190 may be a dielectric material, such as any suitable ILD. In some embodiments, the insulating material 190 may be an oxide material, silicon oxide, carbon-doped oxide, silicon oxynitride, and/or a polymer material. In some embodiments, the insulating material 190 may be deposited using CVD. The insulating material 190 may have any suitable thickness. In some embodiments, the insulating material 190 may have a thickness between 10 nanometers and 30 nanometers (e.g., between 10 nanometers and 20 nanometers).

Figure 12:
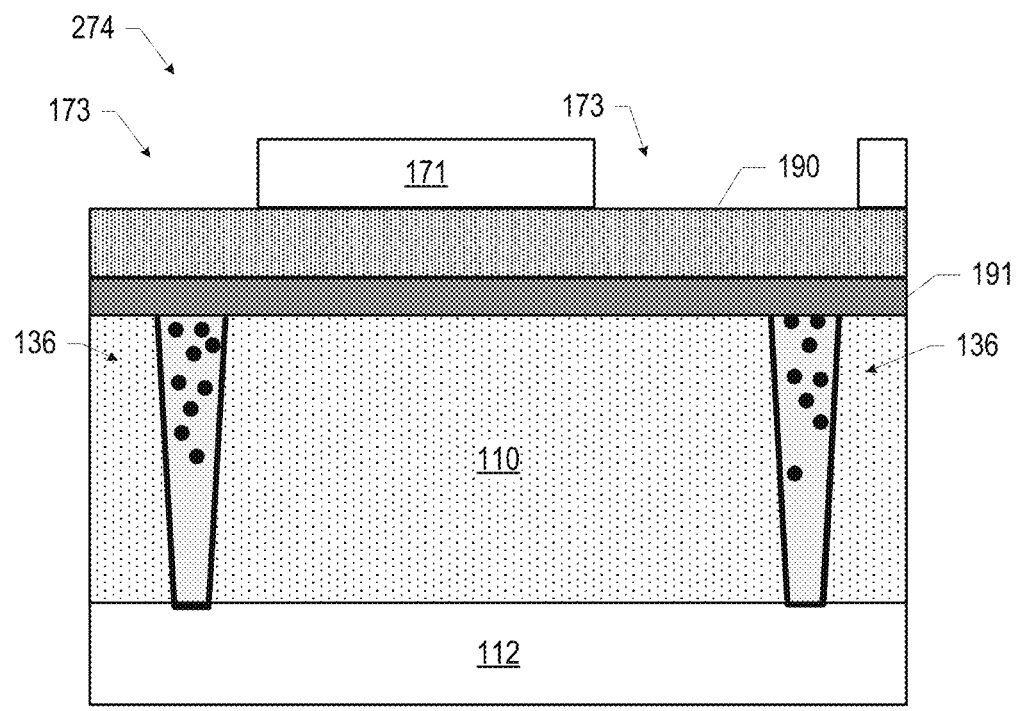

FIG. 12 is a cross-sectional view of an assembly 274 subsequent to providing a resist material 185 on the assembly 272 (FIG. 11) and patterning the resist material 171. The provision and patterning of the resist material 171 may take any suitable form (e.g., as discussed above with reference to FIGS. 4 and 5). In some embodiments, the resist material 171 may have the same material composition as the resist material 185; in other embodiments, the resist material 171 and the resist material 185 may have different material compositions. The patterned resist material 171 may include openings 173 that extend down to and expose portions of the insulating material 190.

Figure 13:
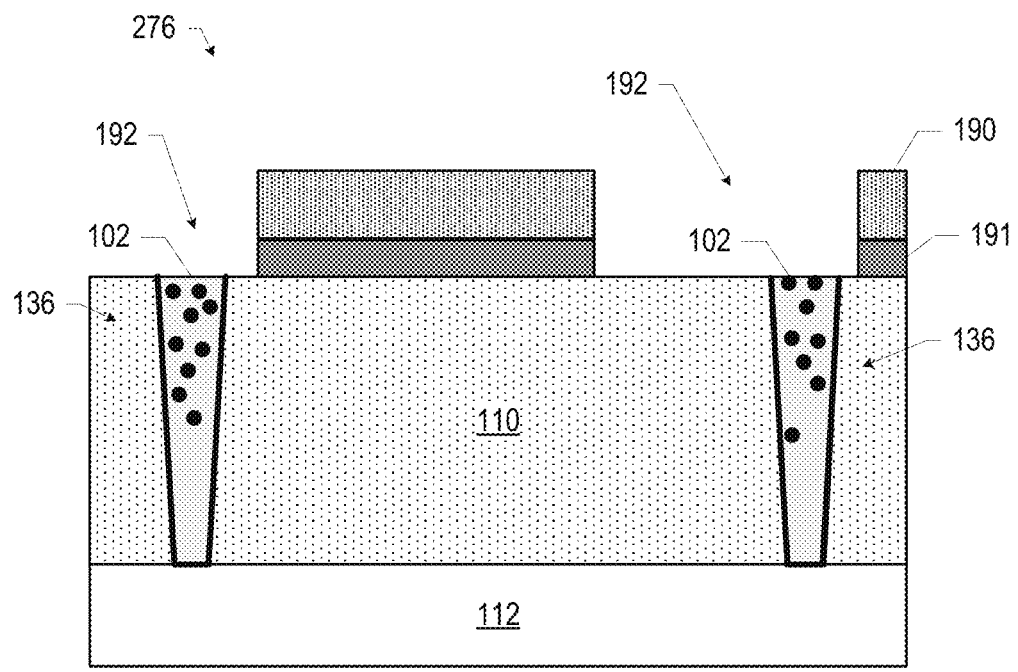

FIG. 13 is a cross-sectional view of an assembly 276 subsequent to etching the insulating material 190 and the etch stop material 191 in accordance with the pattern provided by the patterned resist material 171 of the assembly 274 (FIG. 12), and removing the remaining resist material 171. In particular, trenches 192 may be formed in the insulating material 190 and the etch stop material 191 at locations corresponding to the locations of the openings 173 in the resist material 171. The trenches 192 may extend down to the insulating material 110 and may expose the conductive vias 136. In some embodiments, the formation of the trenches 192 may be a two-step process: first, the insulating material 190 may be etched (with the etch stop material 191 stopping that etch, and thus mitigating overetch into the insulating material 110), then the etch stop material 191 may be etched. In some embodiments, the trenches 192 may be tapered (not illustrated in FIG. 13).

Figure 14:
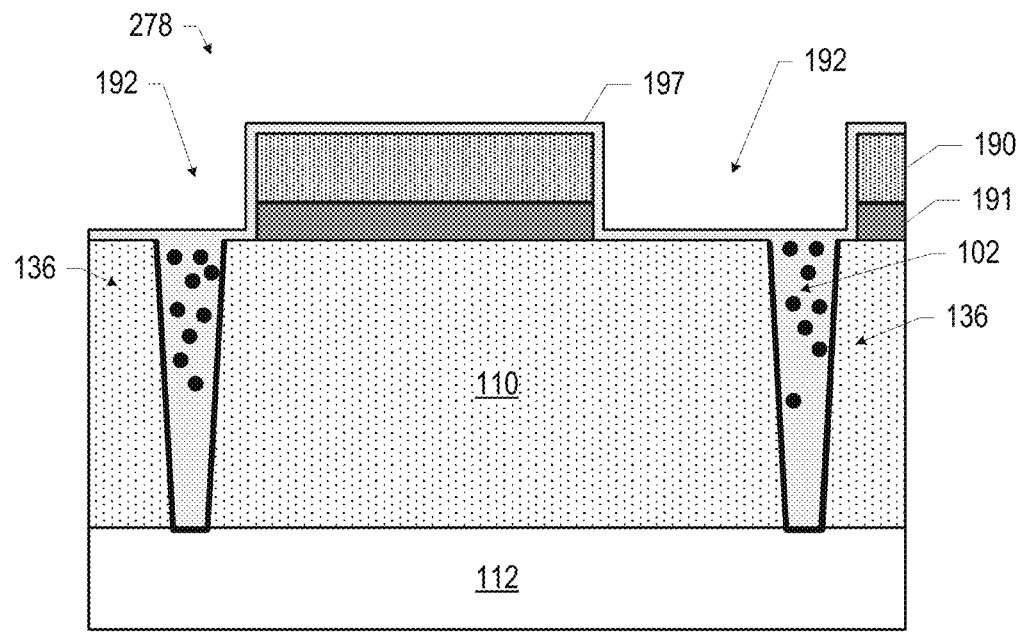

FIG. 14 is a cross-sectional view of an assembly 278 subsequent to providing a seed layer 197 of conductive material on the assembly 276 (FIG. 13) such that the seed layer 197 extends over the walls and bottoms of the trenches 192 (as well as over the exposed top surfaces of the patterned insulating material 190). In particular, the seed layer 197 may be in conductive contact with the conductive vias 136. The seed layer 197 may be formed of a same material as the first material 104, and as discussed below with reference to FIG. 15, may facilitate electroplating of additional such material. In some embodiments, the seed layer 197 may be formed of ruthenium, cobalt, or copper. In some embodiments, a liner material (not shown) may be provided on the assembly 278 before the seed layer 197 is provided; this liner material may take the form of any of the liner materials 108 disclosed herein, and may be provided by ALD, CVD, or sputtering, for example.

Figure 15:
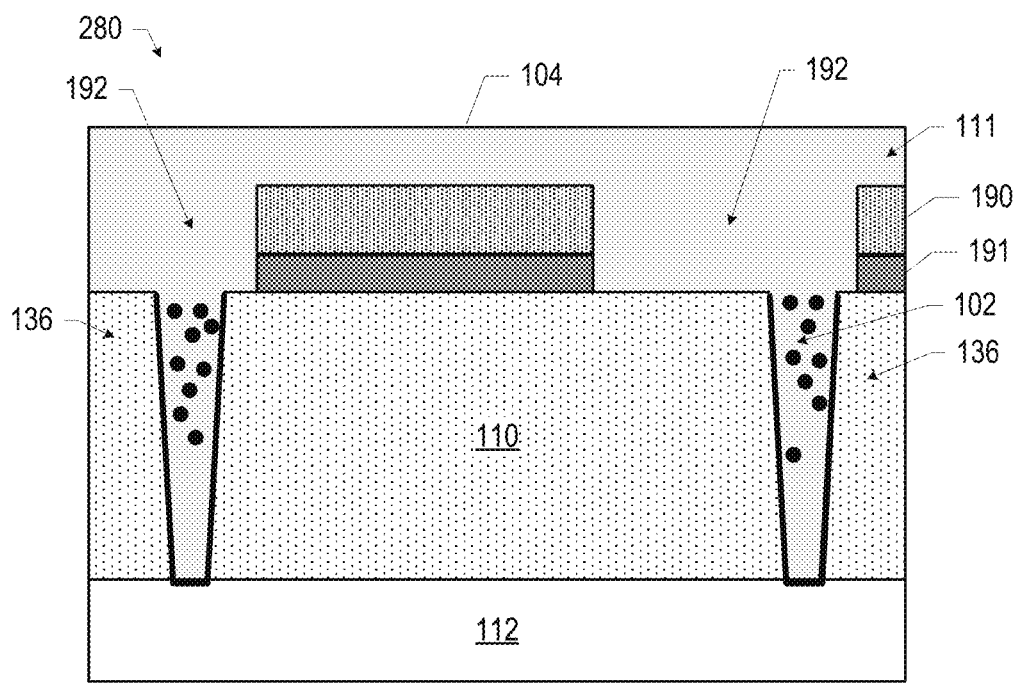

FIG. 15 is a cross-sectional view of an assembly 280 subsequent to providing additional first material 104 on the seed layer 197 of the assembly 278 (FIG. 14). In particular, the additional first material 104 may fill the trenches 192, and in some embodiments may extend beyond the trenches 192 over the adjacent insulating material 190 (as shown) to provide overburden 111. In some embodiments, the additional first material 104 may be electroplated onto the assembly 278 to form the assembly 280. The additional first material 104 may take the form of any of the embodiments of the first material 104 discussed herein (e.g., a superconducting material). In some embodiments, the additional first material 104 may not be provided by electroplating, but may instead be provided by electroless deposition (e.g., when the additional first material 104 includes copper or tin), ALD (e.g., when the additional conductive material includes titanium nitride), or sputtering, for example.

Figure 16:
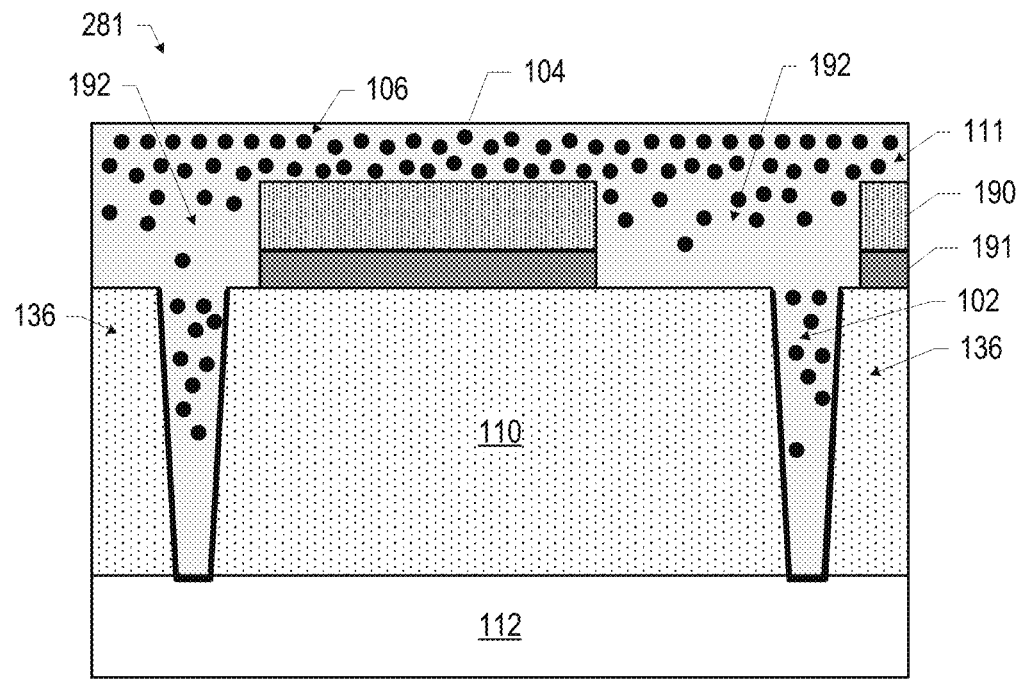
Figure 17:
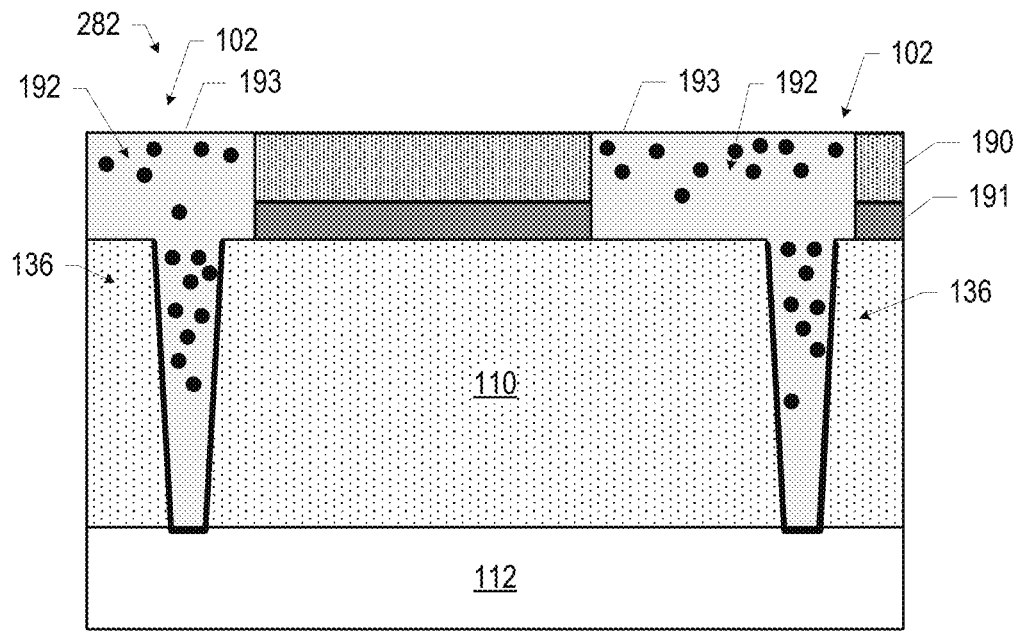

FIG. 16 is a cross-sectional view of an assembly 281 subsequent to providing a second material 106 to the additional first material 104 of the assembly 280 (FIG. 15). The second material 106 may take any of the forms disclosed herein, and the provision may be performed in accordance with any of the embodiments disclosed herein (e.g., as discussed above with reference to FIG. 9). The concentration of the second material 106 in the additional first material 104 may be greatest in the overburden 111, and may decrease within the first material 104 in the trenches 192. In some embodiments, the assembly 281 may be annealed, in accordance with any of the embodiments discussed herein. In some embodiments, the assembly 280 may be planarized to a small degree prior to providing the second material 106 to form the assembly 281. FIG. 17 is a cross-sectional view of an assembly 282 subsequent to planarizing the assembly 281 (FIG. 16) to remove the overburden 111 of the assembly 281. The resulting first material 104 that fills the trenches 192 may provide conductive lines 193 in conductive contact with the conductive vias 136; the conductive lines 193 are an embodiment of the interconnects 100 disclosed herein. In particular, the conductive lines 193 may include some of the second material 106 at their top surface (to control the grain structure at the top surface for planarization, as discussed above), and the concentration of that second material 106 may decrease toward the bottom surface of the conductive lines 193. The operations discussed above with reference to FIGS. 11-17 may represent a type of single Damascene process for forming the conductive lines 193; any suitable embodiments of such a process may be used to form interconnects in an IC device 150, in accordance with the techniques disclosed herein. In some embodiments, the conductive lines 193 of the assembly 282 may extend into and out of the plane of the drawing, providing conductive pathways to route electrical signals to and/or from conductive vias 136.

Figure 18:
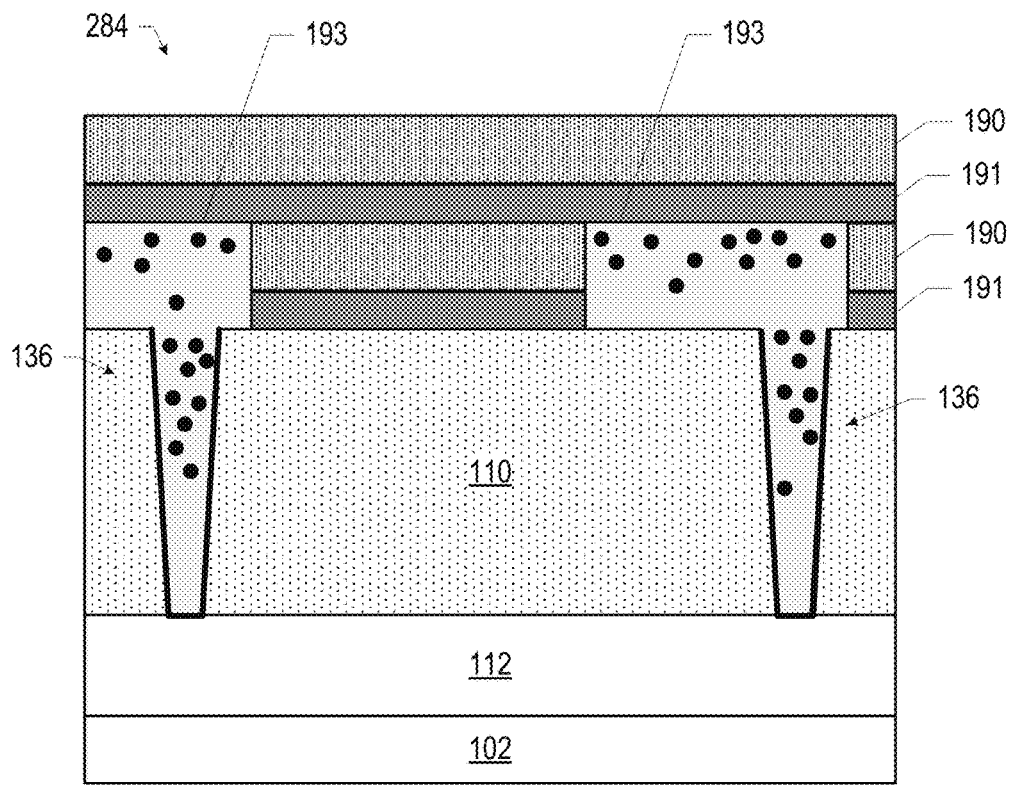

FIG. 18 is a cross-sectional view of an assembly 284 subsequent to depositing additional etch stop material 191 and additional insulating material 190 on the assembly 282 (FIG. 17). The additional etch stop material 191 may be provided between the assembly 282 and the additional insulating material 190, as shown, and may be provided in accordance with any of the embodiments discussed above with reference to FIG. 11.

Figure 19:
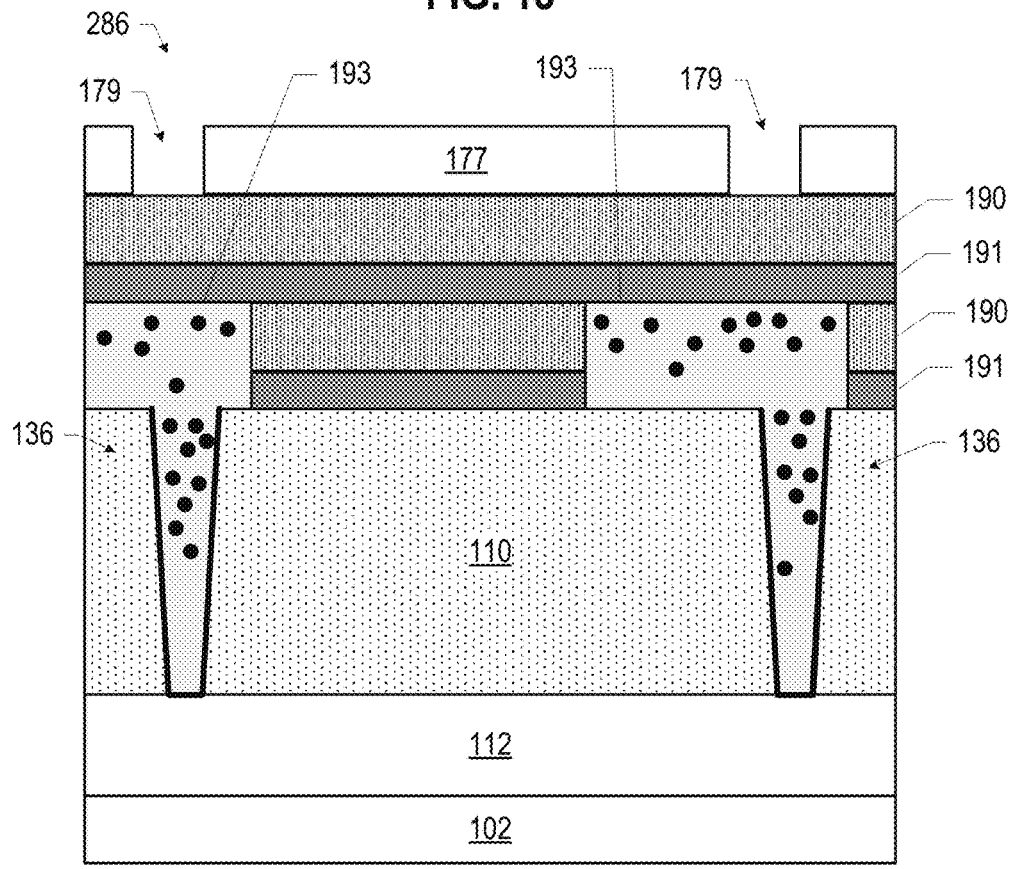

FIG. 19 is a cross-sectional view of an assembly 286 subsequent to providing a resist material 177 on the assembly 284 (FIG. 18) and patterning the resist material 177. The provision and patterning of the resist material 177 may take any suitable form (e.g., as discussed above with reference to FIGS. 4-5). In some embodiments, the resist material 177 may have the same material composition as the resist material 171; in other embodiments, the resist material 177 and the resist material 171 may have different material compositions. The patterned resist material 177 may include openings 179 that extend down to and expose portions of the additional insulating material 190.

Figure 20:
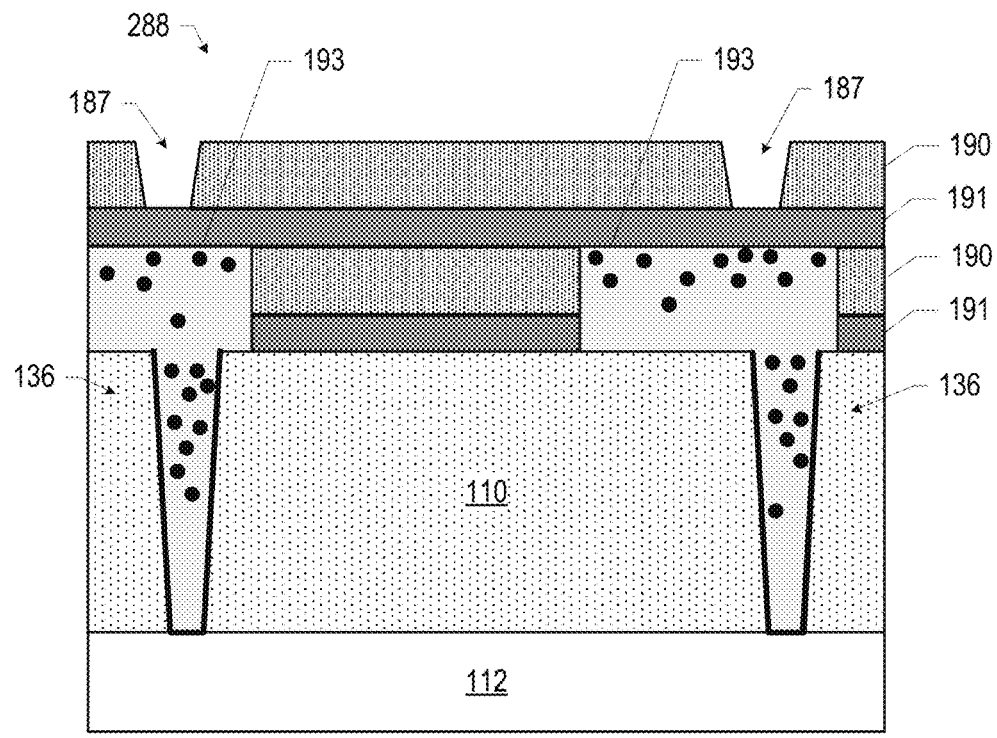

FIG. 20 is a cross-sectional view of an assembly 288 subsequent to etching the additional insulating material 190 in accordance with the pattern provided by the patterned resist material 177 of the assembly 286 (FIG. 19), and removing the remaining resist material 177. In particular, trenches 187 may be formed in the additional insulating material 190 at locations corresponding to the locations of the openings 179 in the resist material 177. The trenches 187 may extend down to the additional etch stop material 191 (which may serve as an etch stop for the formation of the trenches 187). In some embodiments, the trenches 187 may be tapered, as shown.

Figure 21:
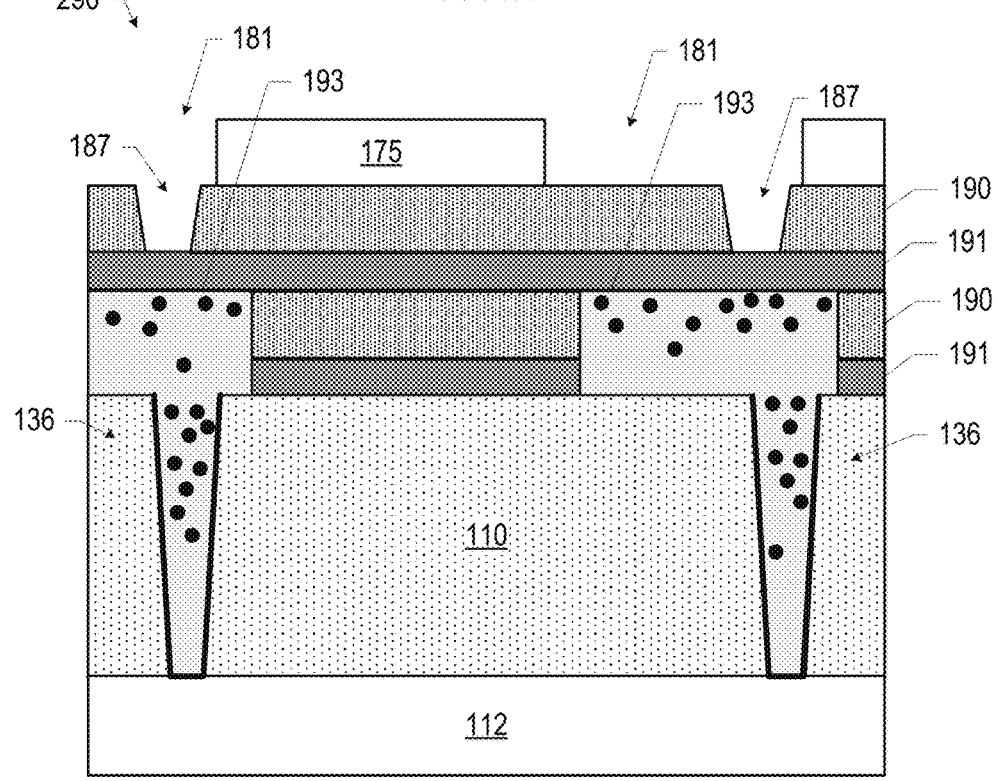

FIG. 21 is a cross-sectional view of an assembly 290 subsequent to providing a resist material 175 on the assembly 288 (FIG. 20) and patterning the resist material 175. The provision and patterning of the resist material 175 may take any suitable form (e.g., as discussed above with reference to FIGS. 4-5). In some embodiments, the resist material 175 may have the same material composition as the resist material 177; in other embodiments, the resist material 175 and the resist material 177 may have different material compositions. The patterned resist material 175 may include openings 181 that extend down to and expose portions of the additional insulating material 190, and also expose the trenches 187 in the additional insulating material 190.

Figure 22:
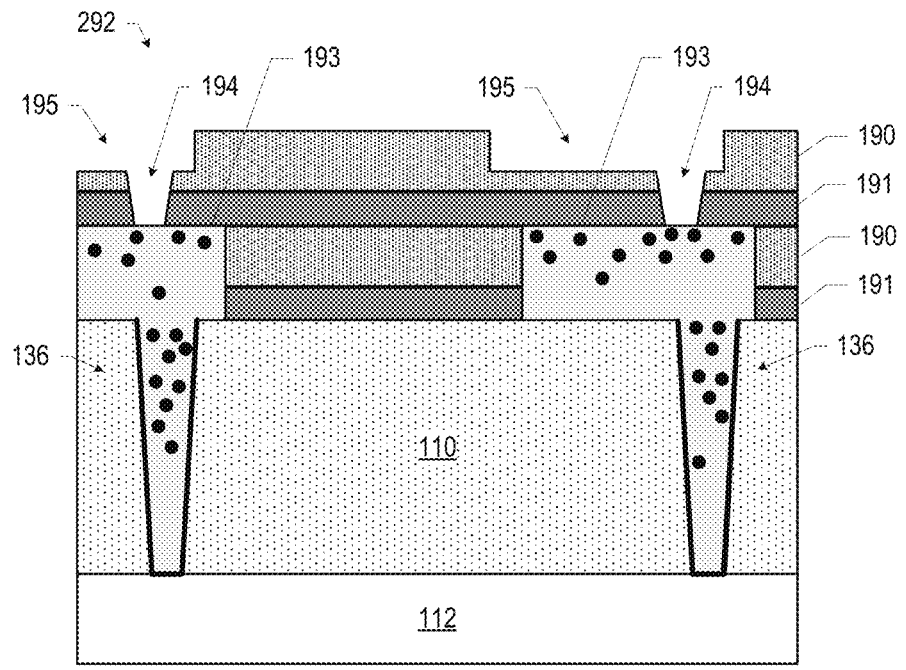

FIG. 22 is a cross-sectional view of an assembly 292 subsequent to etching the additional insulating material 190 and the additional etch stop material 191 in accordance with the pattern provided by the patterned resist material 175 of the assembly 290 (FIG. 21), and removing the remaining resist material 175. In particular, a timed etch may be used to remove some of the additional etch stop material 191 that was not protected by the resist material 175, leaving trenches 195. After the timed etch, the additional etch stop material 191 at the bottom of the trenches 187 may be removed to form trenches 194 (e.g., as part of a two-step process, as discussed above with reference to FIG. 13). The trenches 195 may extend over the trenches 194, as shown.

Figure 23:
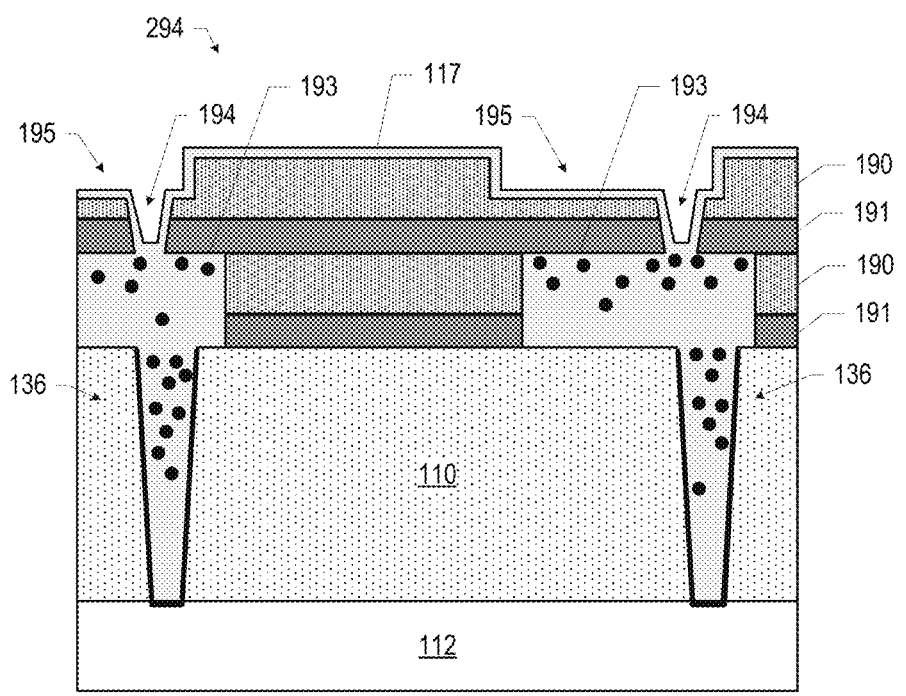

FIG. 23 is a cross-sectional view of an assembly 294 subsequent to providing a seed layer 117 of conductive material on the assembly 292 (FIG. 22) such that the seed layer 117 extends over the walls and bottoms of the trenches 194 and 195 (as well as over the exposed top surfaces of the additional insulating material 190). In particular, the seed layer 117 may be in conductive contact with the conductive lines 193. The seed layer 117 may take the form of any of the embodiments of the seed layer 197, discussed above.

Figure 24:
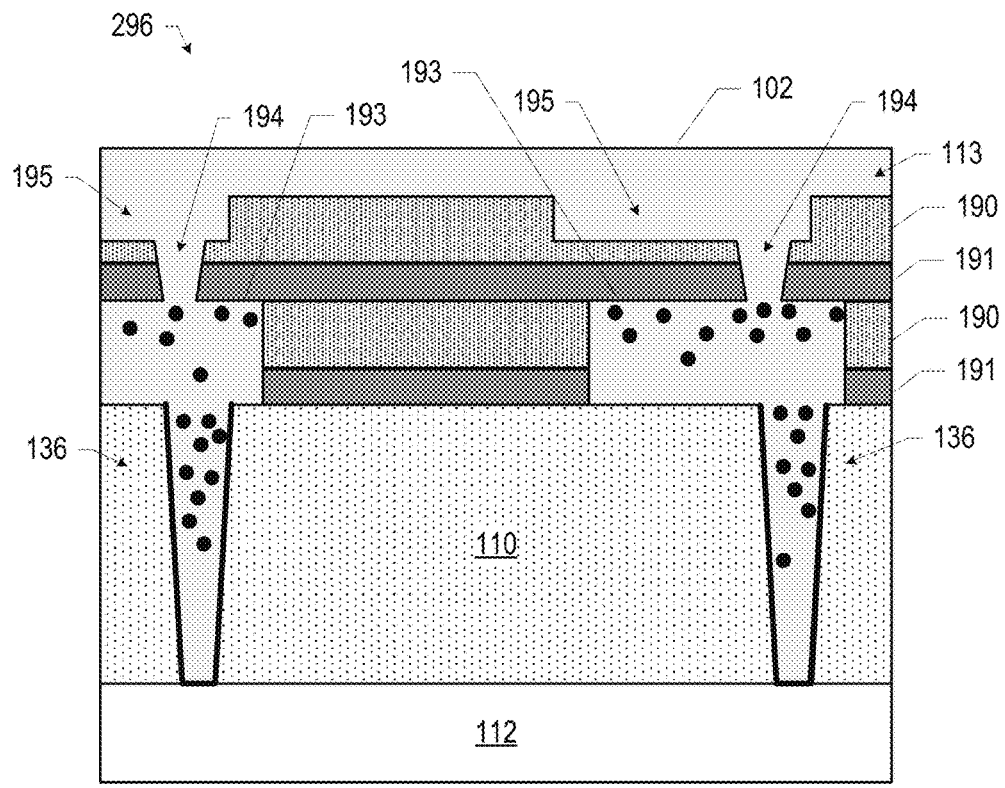

FIG. 24 is a cross-sectional view of an assembly 296 subsequent to providing additional first material 104 on the seed layer 117 of the assembly 294 (FIG. 23). In particular, the additional first material 104 may fill the trenches 194 and 195, and in some embodiments may extend beyond the trenches 194 and 195 over the adjacent insulating material 190 to provide overburden 113 (as shown). In some embodiments, the additional first material 104 may be electroplated onto the assembly 294 to form the assembly 296.

Figure 25:
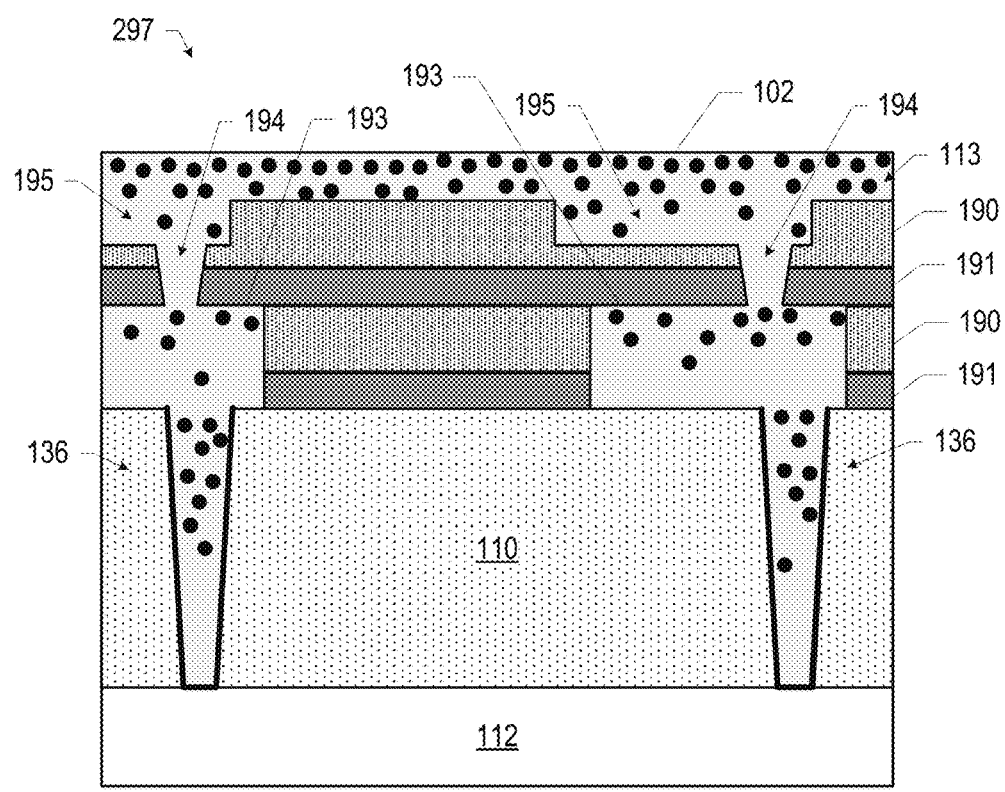

FIG. 25 is a cross-sectional view of an assembly 297 subsequent to providing a second material 106 to the additional first material 104 of the assembly 296 (FIG. 24). The second material 106 may take any of the forms disclosed herein, and the provision may be performed in accordance with any of the embodiments disclosed herein (e.g., as discussed above with reference to FIG. 9). The concentration of the second material 106 in the additional first material 104 may be greatest in the overburden 113, and may decrease within the first material 104 in the trenches 195. In some embodiments, the assembly 297 may be annealed, in accordance with any of the embodiments discussed herein. In some embodiments, the assembly 296 may be planarized to a small degree prior to providing the second material 106 to form the assembly 297.

Figure 26:
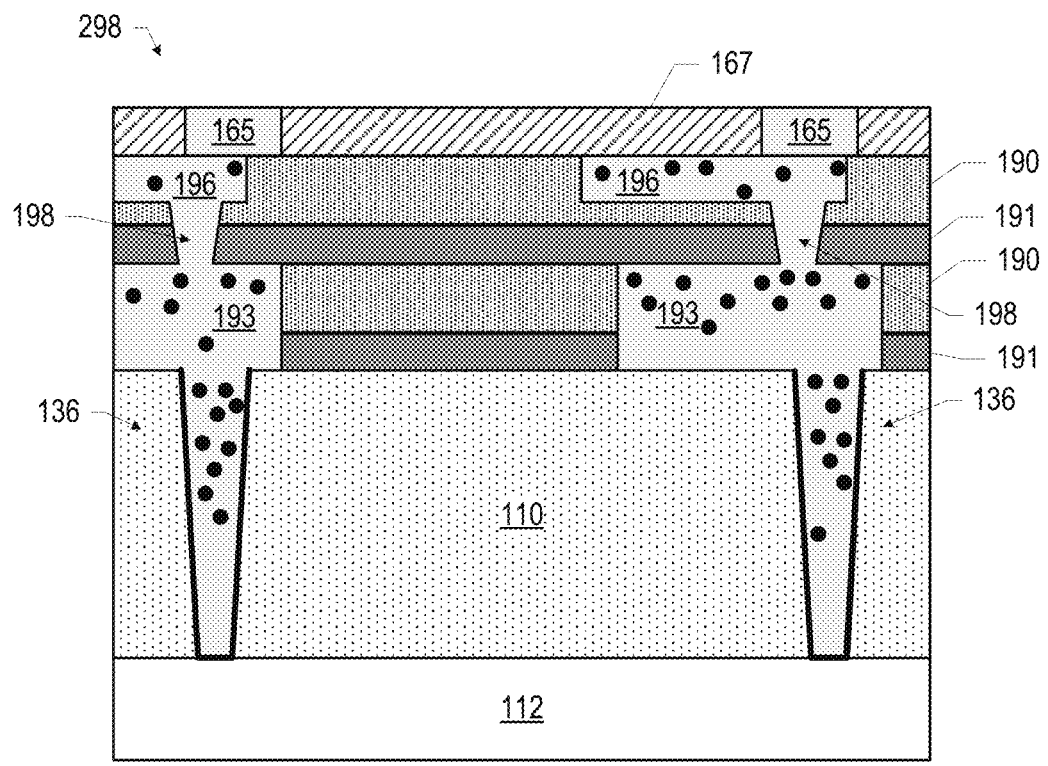

FIG. 26 is a cross-sectional view of an assembly 298 subsequent to planarizing the assembly 297 (FIG. 25) to remove the overburden 113 of the assembly 297, forming conductive contacts 165 on the planarized surface, and providing a solder resist material 167 around the conductive contacts 165 on the planarized surface. The resulting first material 104 that fills the trenches 195 may provide conductive vias 198 in conductive contact with the conductive lines 193, and the first material 104 that fills the trenches 194 may provide conductive lines 196 in conductive contact with the conductive vias 198. The conductive contacts 165 may be in conductive contact with the conductive lines 196. The conductive lines 196 are an embodiment of the interconnects 100 disclosed herein; in particular, the conductive lines 196 may include some of the second material 106 at their top surface (to control the grain structure at the top surface for planarization, as discussed above), and the concentration of that second material 106 may decrease toward the bottom surface of the conductive lines 196. In some embodiments, the conductive vias 198 may be an embodiment of the interconnects 100 disclosed herein; in particular, the conductive vias 198 may include some of the second material 106 at their top surface (to control the grain structure at the top surface for planarization, as discussed above), and the concentration of that second material 106 may decrease toward the bottom surface of the conductive vias 198. In some embodiments, the conductive lines 196 of the assembly 298 may extend into and out of the plane of the drawing. Before providing the conductive contacts 165 and the solder resist material 167, additional conductive vias and lines may be formed on the conductive lines 196 by repeating the operations discussed above with reference to FIGS. 18-26 to form any desired interconnect structures for electrical contact with the IC structure 112. The operations discussed above with reference to FIGS. 18-26 may represent a dual Damascene process for forming conductive lines and vias, in accordance with the present disclosure; any suitable embodiments of such a process may be used to form interconnects 100 in an IC device 150.

During operation of an IC device 150, electrical signals (such as power and/or input/output (I/O) signals) may be routed to and/or from different elements in the IC device 150 through the interconnects 100 and additional conductive vias and/or lines. The combination of the interconnects (e.g., the interconnects 100 and additional interconnects) and the proximate insulating material (e.g., the insulating material 110, the insulating material 190, and the etch stop material 191) may provide an interlayer dielectric (ILD) stack of the IC device 150. As noted above, interconnect structures may be arranged within an IC device 150 to route electrical signals according to a wide variety of designs (in particular, the arrangement is not limited to the particular configuration of interconnect structures depicted in FIG. 26 or any of the other accompanying figures, and may include more or fewer interconnect structures).

The solder resist material 167 (e.g., a polyimide or similar material) may be disposed around the conductive contacts 165, and in some embodiments may extend onto the conductive contacts 165 (not shown). The conductive contacts 165 may provide the contacts to couple other components (e.g., a package substrate or other component) to the interconnect structures in the IC device 150, and may be formed of any suitable conductive material (e.g., a superconducting material). For example, solder bonds may be formed on the one or more conductive contacts 165 to mechanically and/or electrically couple a chip including the IC device 150 with another component (e.g., a circuit board). The conductive contacts 165 illustrated in FIG. 26 take the form of bond pads, but other first level interconnect structures may be used (e.g., posts) to route electrical signals to/from the IC device 150.

The manufacturing techniques illustrated in FIGS. 4-26 are illustrative examples of techniques that may be used to form some embodiments of the interconnects 100 disclosed herein, but other techniques may be used instead of or in combination with the techniques discussed above. For example, FIGS. 27-31 illustrate various alternative manufacturing operations using subtractive techniques for forming various interconnects 100 in an IC device 150. In the example depicted in FIGS. 27-31, the conductive lines 193 (discussed above with reference to FIG. 17) may be formed using a subtractive process (e.g., instead of the additive process illustrated by FIGS. 11-17). In some embodiments, the operations discussed below with reference to FIGS. 27-31 may replace the operations discussed above with reference to FIGS. 11-17.

Figure 27:
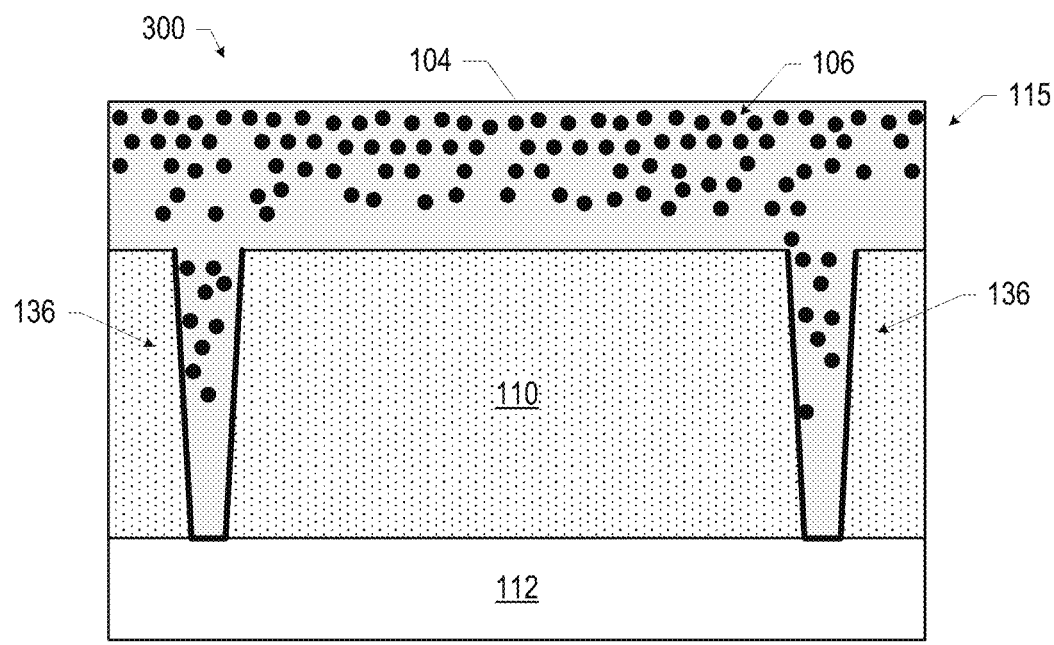
FIGS. 27-31 illustrate various alternative example stages in the formation of interconnects in an IC device, in accordance with various embodiments.

FIG. 27 is a cross-sectional view of an assembly 300 subsequent to providing a first material 104 on the assembly 270 (FIG. 10) and providing a second material 106 to the first material 104. The first material 104 may include overburden 115. The first material 104 may be provided using any suitable technique (e.g., sputtering), and may be in conductive contact with the conductive vias 136, as shown. The first material 104 may take the form of any of the metals 104 disclosed herein (e.g., a superconducting material). The second material 106 may take any of the forms disclosed herein, and its provision may be performed in accordance with any of the embodiments disclosed herein (e.g., as discussed above with reference to FIG. 9). The concentration of the second material 106 in the first material 104 may be greatest in the overburden 115, and may decrease within the first material 104 toward the IC structure 112. In some embodiments, the assembly 300 may be annealed, in accordance with any of the embodiments discussed herein. The first material 104 and second material 106 may together provide a conductive material 102. In some embodiments, the first material 104 may be planarized to a small degree prior to providing the second material 106 to form the assembly 300.

Figure 28:
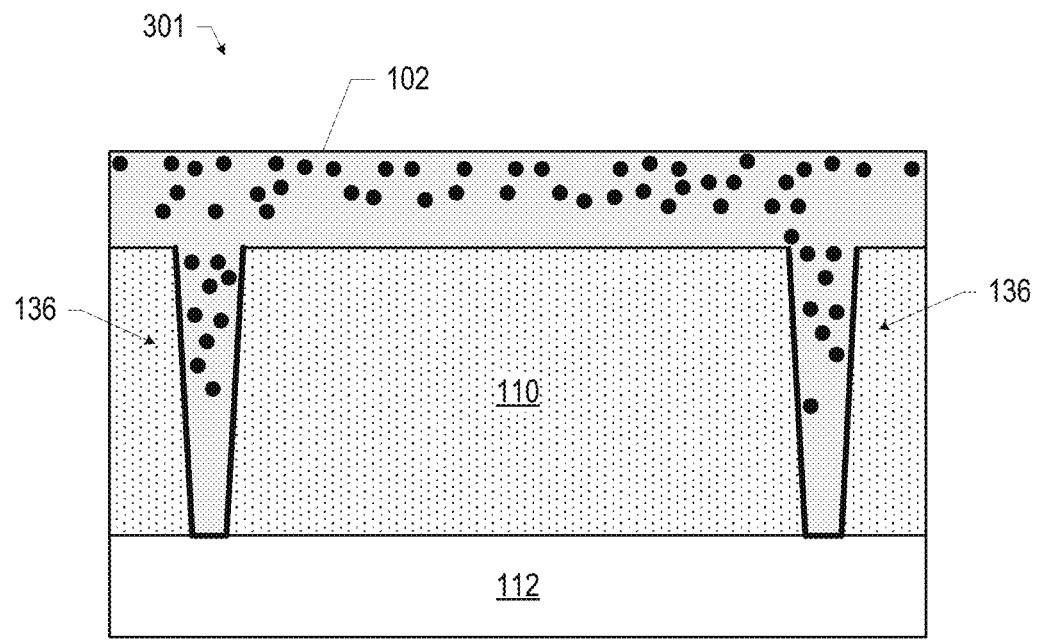

FIG. 28 is a cross-sectional view of an assembly 301 subsequent to planarizing the assembly 300 (FIG. 27) to remove the overburden 115 (e.g., using CMP). The first material 104 and the second material 106 may provide the conductive material 102 of an interconnect 100, as discussed below.

Figure 29:
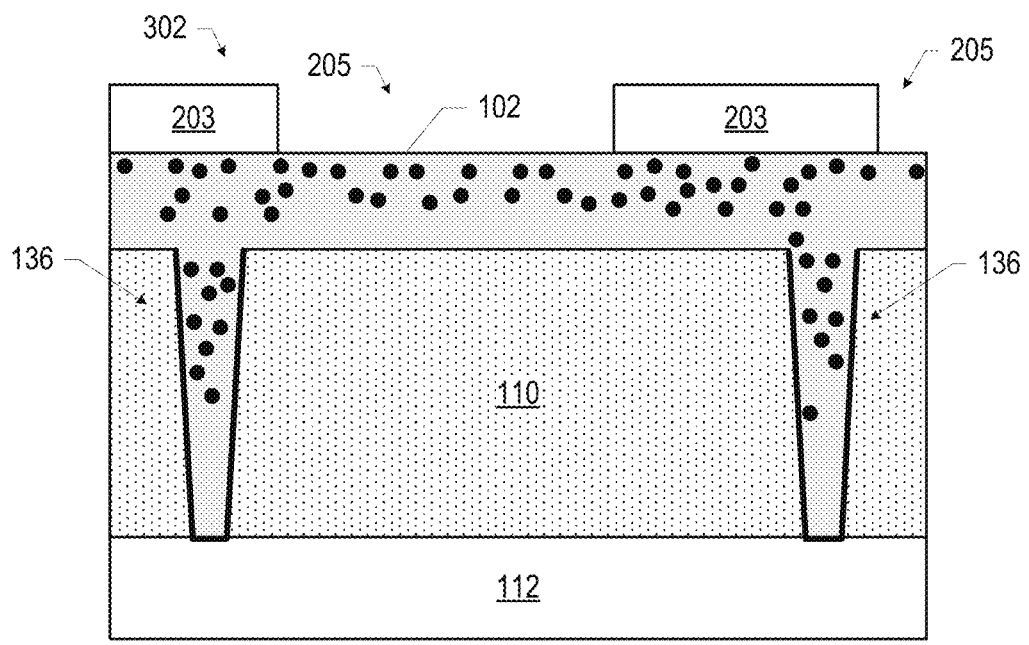

FIG. 29 is a cross-sectional view of an assembly 302 subsequent to providing a resist material 203 on the assembly 301 (FIG. 28) and patterning the resist material 203. The provision and patterning of the resist material 203 may take any suitable form (e.g., as discussed above with reference to FIGS. 4-5). The resist material 203 may be any resist material suitable for etching the first material 104, as discussed below. The patterned resist material 203 may include openings 205 that extend down to and expose portions of the conductive material 102.

Figure 30:
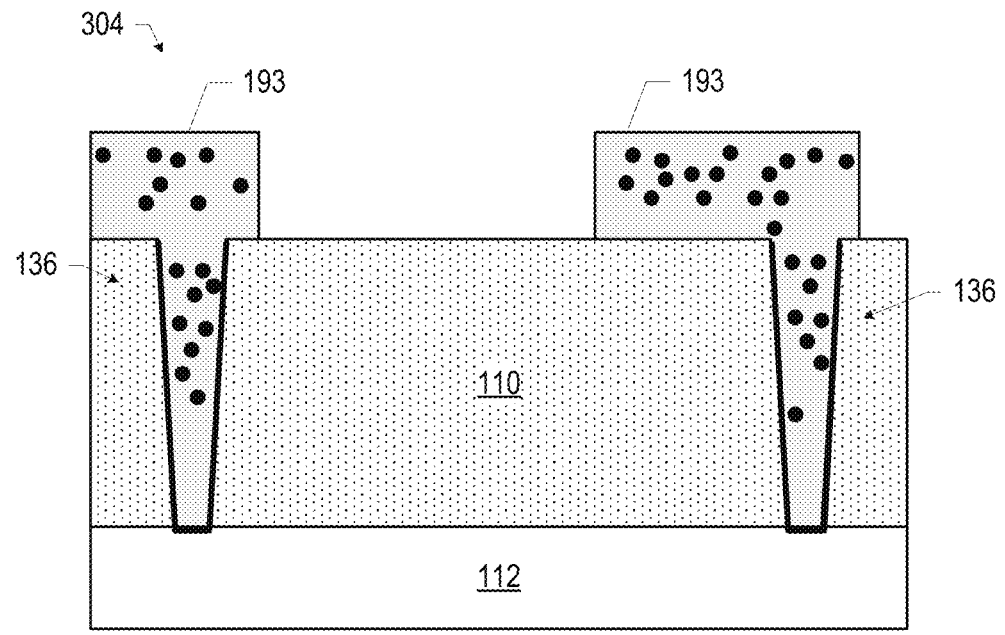

FIG. 30 is a cross-sectional view of an assembly 304 subsequent to etching the exposed conductive material 102, in accordance with the pattern provided by the patterned resist material 203 of the assembly 302 (FIG. 29), and removing the remaining resist material 203. The remaining patterned conductive material 102 (in conductive contact with the conductive vias 136) may provide the conductive lines 193, as discussed above.

Figure 31:
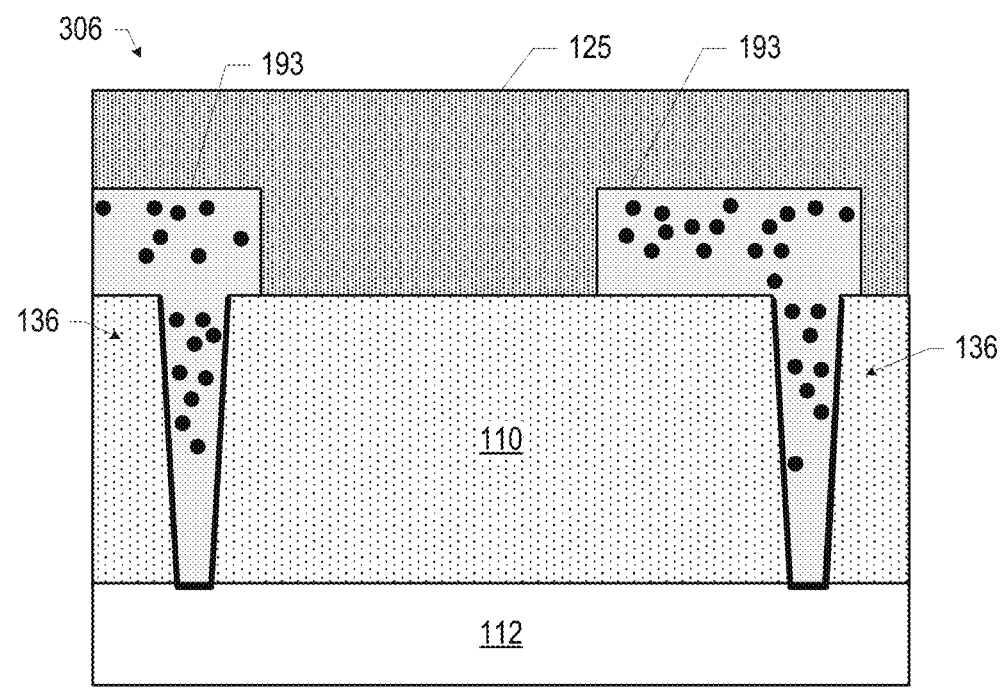

FIG. 31 is a cross-sectional view of an assembly 306 subsequent to providing an insulating material 125 (e.g., a dielectric material) around the conductive lines 193 of the assembly 304 (FIG. 30). The insulating material 125 may be an insulating material (e.g., any of the materials discussed above with reference to the insulating material 190) or any other suitable material, and may be deposited using any suitable technique. In some embodiments, the insulating material 125 may be planarized subsequent to deposition so as to provide a flat surface on which subsequent layers of conductive vias and lines may be built (e.g., using any of the techniques discussed herein).

Although particular patterning techniques are discussed herein, any suitable patterning techniques and materials may be used in the manufacture of the interconnects 100 disclosed herein. For example, self-aligned double patterning techniques, hardmask lithography techniques, or antireflective coating (ARC) techniques may be used. In another example, air gap dielectrics may be included in any of the insulating materials, and air gap formation techniques may be incorporated into the process of manufacturing an interconnect 100, as suitable.

Figure 32:
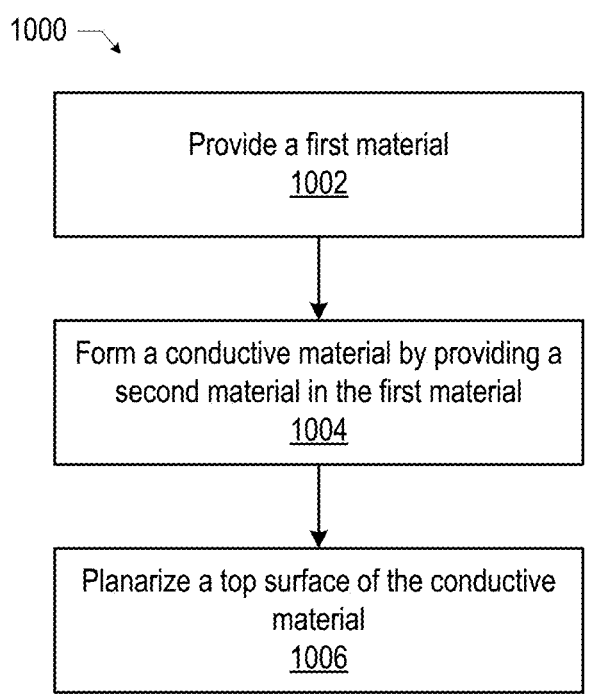
FIG. 32 is a flow diagram of an illustrative method of manufacturing an interconnect, in accordance with various embodiments.

As noted above, any suitable techniques may be used to manufacture the interconnects 100 disclosed herein. FIG. 32 is a flow diagram of an illustrative method 1000 of manufacturing an interconnect, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable interconnect (including any suitable ones of the embodiments disclosed herein).

At 1002, a first material may be provided. For example, a first material 104 may be provided on an IC assembly (e.g., as discussed above with reference to FIGS. 8, 15, 24, and 27).

At 1004, a conductive material may be formed by providing a second material in the first material. For example, a conductive material 102 may be formed by doping, diffusing, or otherwise providing a second material 106 in the first material 104 (e.g., as discussed above with reference to FIG. 9).

At 1006, a top surface of the conductive material may be planarized. For example, a top surface 114 of the conductive material 102 may be planarized (using, e.g., a CMP technique). The conductive material may have particularly small grains at the top surface or particularly large grains at the top surface (e.g., as discussed above with reference to FIGS. 2 and 3).

The interconnects disclosed herein may be included in any suitable IC device, which may in turn be included in any suitable computing device. FIGS. 33-36 illustrate various examples of apparatuses that may include any of the interconnects disclosed herein. Similarly, the methods disclosed herein may be used in any suitable stage in the manufacture of an apparatus, including any of the apparatuses discussed below with reference to FIGS. 33-36.

FIGS. 33A-B are top views of a wafer 2300 and dies 2302 that may include one or more interconnects in accordance with any of the embodiments disclosed herein (e.g., the interconnects 100). An interconnect may be one of multiple IC structures formed on the wafer 2300. The wafer 2300 may be composed of semiconductor material and may include one or more dies 2302 having IC structures formed on a surface of the wafer 2300. Each of the dies 2302 may be a repeating unit of a semiconductor product that includes one or more of the interconnects. After the fabrication of the semiconductor product is complete, the wafer 2300 may undergo a singulation process in which each of the dies 2302 is separated from one another to provide discrete "chips" of the semiconductor product. Thus, the interconnects may be present in the wafer 2300 due to its presence in the dies 2302. In particular, the interconnects may be included in an apparatus that takes the form of the wafer 2300 (e.g., not singulated) or the form of the die 2302 (e.g., singulated). As discussed above, the interconnects may be part of a multi-transistor structure included in the die 2302.

In some embodiments, an interconnect may be included in a memory device (e.g., a static random access memory (SRAM) device), a logic device (e.g., an AND, OR, NAND, or NOR gate), or any other suitable circuit element. Multiple ones of these devices may be combined on a single die 2302. For example, a memory array formed by multiple memory devices may be formed on a same die 2302 as a processing device (e.g., the processing device 2602 of FIG. 36) or other logic that is configured to store information in the memory devices or execute instructions stored in the memory array; any one or more of these devices may include one or more interconnects.

FIG. 34 is a cross-sectional side view of an IC device 2400 that may include one or more interconnects in accordance with any of the embodiments disclosed herein (e.g., any of the interconnects 100). The IC device 2400 may thus be an embodiment of the IC device 150. The IC device 2400 may be formed on a substrate 2402 (e.g., the wafer 2300 of FIG. 33A) and may be included in a die (e.g., the die 2302 of FIG. 33B). The substrate 2402 may be a semiconductor substrate composed of semiconductor material systems including, for example, N-type or P-type materials systems. The substrate 2402 may include, for example, a crystalline substrate formed using a bulk silicon or a silicon-on-insulator substructure. In some embodiments, the semiconductor substrate 2402 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2402. Although a few examples of materials from which the substrate 2402 may be formed are described here, any material that may serve as a foundation for an IC device 2400 may be used. The substrate 2402 may be part of a singulated die (e.g., the dies 2302 of FIG. 33B) or a wafer (e.g., the wafer 2300 of FIG. 33A).

The IC device 2400 may include one or more device layers 2404 disposed on the substrate 2402. The device layer 2404 may include features of one or more transistors 2440 (e.g., metal oxide semiconductor field effect transistors (MOSFETs)) formed on the substrate 2402. The device layer 2404 may include, for example, one or more source and/or drain (S/D) regions 2420, a gate 2422 to control current flow in transistors 2440 between the S/D regions 2420, and one or more S/D contacts 2424 to route electrical signals to/from the S/D regions 2420. The transistors 2440 may include additional features not depicted for the sake of clarity such as device isolation regions, gate contacts, and the like. The transistors 2440 are not limited to the type and configuration depicted in FIG. 34 and may include a wide variety of other types and configurations such as, for example, planar transistors, non-planar transistors, or a combination of both.

Non-planar transistors may include FinFET transistors, such as double-gate transistors or tri-gate transistors, and wrap-around or all-around gate transistors, such as nanoribbon and nanowire transistors.

Although the transistors 2440 illustrated in FIG. 34 are planar transistors, the IC device 2400 may include non-planar transistors and/or multi-transistor structures arranged vertically on a fin, in addition to or instead of planar transistors. Additionally, a computing device (e.g., the computing device 2600 of FIG. 36) may include planar transistors, non-planar transistors, devices with multiple transistors arranged vertically on a fin, etc.

Each transistor 2440 may include a gate 2422 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work function metal or N-type work function metal, depending on whether the transistor 2440 is to be a PMOS or an NMOS transistor. In some implementations, the gate electrode layer may include a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals, such as hafnium carbide, zirconium carbide, titanium carbide, tantalum carbide, and aluminum carbide.

In some embodiments, when viewed as a cross-section of the transistor 2440 along the source-channel-drain direction, the gate electrode may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. In some embodiments, a plurality of spacer pairs may be used; for instance, two pairs, three pairs, or four pairs of sidewall spacers may be formed on opposing sides of the gate stack. The sidewall spacers may be formed using conventional methods of forming selective spacers, as known in the art. In some embodiments, a conformal dielectric spacer layer, such as, but not limited to, silicon oxide, silicon nitride, silicon oxynitride, and combinations thereof, is first blanket-deposited on all structures. The dielectric spacer layer may be deposited in a conformal manner so that it has substantially equal thicknesses on both vertical surfaces and horizontal surfaces. The dielectric spacer layer may be deposited using conventional CVD methods such as low-pressure chemical vapor deposition (LPCVD) and plasma enhanced chemical vapor deposition (PECVD), for example. In some embodiments, the dielectric spacer layer may be deposited to a thickness between 2 nanometers and 10 nanometers. Next, an unpatterned anisotropic etch may be performed on the dielectric spacer layer using conventional anisotropic etch methods, such as reactive ion etching (RIE). During the anisotropic etching process, most of the dielectric spacer layer may be removed from horizontal surfaces, leaving the dielectric spacer layer on the vertical surfaces, as shown. Next, an unpatterned isotropic etch may be performed to remove the remaining dielectric spacer layer from any horizontal surfaces, leaving the sidewall spacers. In some embodiments, the isotropic etch is a wet etch process. In a specific embodiment, where the dielectric spacer layer is silicon nitride or silicon oxide, the isotropic etch may employ a wet etchant solution comprising phosphoric acid ($H_3PO_4$) or a buffered oxide etch (BOE), respectively. In an alternate embodiment, the isotropic etch may be a dry etch process. In one such embodiment, nitrogen trifluoride ($NF_3$) gas may be employed in a downstream plasma reactor to isotropically etch the dielectric spacer layers.

The S/D regions 2420 may be formed within the substrate 2402 adjacent to the gate 2422 of each transistor 2440. The S/D regions 2420 may be formed using either an implantation/diffusion process or an etching/growth process, for example. In some embodiments, one or more layers of metal and/or metal alloys may be included in the S/D regions 2420.

Electrical signals, such as power and/or input/output (I/O) signals, may be routed to and/or from the transistors 2440 of the device layer 2404 through one or more interconnect layers disposed on the device layer 2404 (illustrated in FIG. 34 as interconnect layers 2406-2410). For example, electrically conductive features of the device layer 2404 (e.g., the gate 2422 and the S/D contacts 2424) may be electrically coupled with interconnect structures 2428 of the interconnect layers 2406-2410. The one or more interconnect layers 2406-2410 may form an interlayer dielectric (ILD) stack 2419 of the IC device 2400. Any of the interconnect structures 2428 may take the form of the interconnects 100 disclosed herein.

The interconnect structures 2428 may be arranged within the interconnect layers 2406-2410 to route electrical signals according to a wide variety of designs (in particular, the arrangement is not limited to the particular configuration of interconnect structures 2428 depicted in FIG. 34). Although a particular number of interconnect layers 2406-2410 is depicted in FIG. 34, embodiments of the present disclosure include IC devices having more or fewer interconnect layers 2406-2410 than depicted.

In some embodiments, the interconnect structures 2428 may include conductive lines 2428a and/or conductive vias 2428b filled with an electrically conductive material such as a metal. In some embodiments, the conductive vias 2428b may electrically couple conductive lines 2428a of different interconnect layers 2406-2410 together.

The interconnect layers 2406-2410 may include a dielectric material 2426 disposed between the interconnect structures 2428, as shown in FIG. 34. In some embodiments, the dielectric material 2426 disposed between the interconnect structures 2428 in different ones of the interconnect layers 2406-2410 may have different compositions; in other embodiments, the composition of the dielectric material 2426 between different interconnect layers 2406-2410 may be the same.

A first interconnect layer 2406 (referred to as Metal 1 or "M1") may be formed directly on the device layer 2404. In some embodiments, the first interconnect layer 2406 may include conductive lines 2428a and/or conductive vias 2428b, as shown. Conductive lines 2428a of the first interconnect layer 2406 may be coupled with contacts (e.g., S/D contacts 2424) of the device layer 2404.

A second interconnect layer 2408 (referred to as Metal 2 or "M2") may be formed directly on the first interconnect layer 2406. In some embodiments, the second interconnect layer 2408 may include conductive vias 2428b to couple the conductive lines 2428a of the second interconnect layer 2408 with the conductive lines 2428a of the first interconnect layer 2406. Although the conductive lines 2428a and the conductive vias 2428b are structurally delineated with a line within each interconnect layer (e.g., within the second interconnect layer 2408) for the sake of clarity, the conductive lines 2428a and the conductive vias 2428b may be structurally and/or materially contiguous (e.g., simultaneously filled during a dual-damascene process) in some embodiments.

A third interconnect layer 2410 (referred to as Metal 3 or "M3") (and additional interconnect layers, as desired) may be formed in succession on the second interconnect layer 2408 according to similar techniques and configurations described in connection with the second interconnect layer 2408 on the first interconnect layer 2406.

The IC device 2400 may include a solder resist material 2434 (e.g., polyimide or similar material) and one or more bond pads 2436 formed on the interconnect layers 2406-2410. The bond pads 2436 may be electrically coupled with the interconnect structures 2428 and configured to route the electrical signals of transistor(s) 2440 to other external devices. For example, solder bonds may be formed on the one or more bond pads 2436 to mechanically and/or electrically couple a chip including the IC device 2400 with another component (e.g., a circuit board). The IC device 2400 may have other alternative configurations to route the electrical signals from the interconnect layers 2406-2410 than depicted in other embodiments. For example, the bond pads 2436 may be replaced by or may further include other analogous features (e.g., posts) that route the electrical signals to external components.

Figure 35:
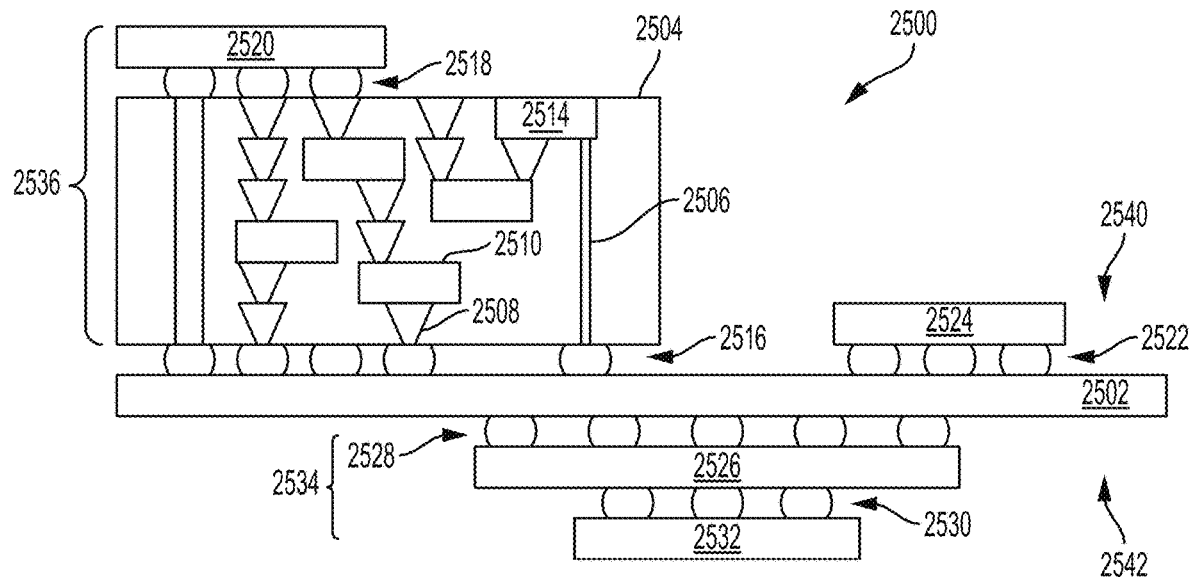
FIG. 35 is a cross-sectional side view of an IC device assembly that may include an interconnect in accordance with any of the embodiments disclosed herein.

FIG. 35 is a cross-sectional side view of an IC device assembly 2500 that may include one or more interconnects, in accordance with any of the embodiments disclosed herein (e.g., the interconnects 100). The IC device assembly 2500 includes a number of components disposed on a circuit board 2502 (which may be, for example, a motherboard). The IC device assembly 2500 includes components disposed on a first face 2540 of the circuit board 2502 and an opposing second face 2542 of the circuit board 2502; generally, components may be disposed on one or both faces 2540 and 2542.

In some embodiments, the circuit board 2502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2502. In other embodiments, the circuit board 2502 may be a non-PCB substrate.

The IC device assembly 2500 illustrated in FIG. 35 includes a package-on-interposer structure 2536 coupled to the first face 2540 of the circuit board 2502 by coupling components 2516. The coupling components 2516 may electrically and mechanically couple the package-on-interposer structure 2536 to the circuit board 2502, and may include solder balls (as shown in FIG. 35), male and female portions of a socket, an adhesive, an underfill material, and/or any other suitable electrical and/or mechanical coupling structure.

The package-on-interposer structure 2536 may include an IC package 2520 coupled to an interposer 2504 by coupling components 2518. The coupling components 2518 may take any suitable form for the application, such as the forms discussed above with reference to the coupling components 2516. Although a single IC package 2520 is shown in FIG. 35, multiple IC packages may be coupled to the interposer 2504; indeed, additional interposers may be coupled to the interposer 2504. The interposer 2504 may provide an intervening substrate used to bridge the circuit board 2502 and the IC package 2520. The IC package 2520 may be or include, for example, a die (the die 2302 of FIG. 33B), an IC device (e.g., the IC device 2400 of FIG. 34, or any of the assemblies disclosed herein), or any other suitable component. Generally, the interposer 2504 may spread a connection to a wider pitch or to reroute a connection to a different connection. For example, the interposer 2504 may couple the IC package 2520 (e.g., a die) to a ball grid array (BGA) of the coupling components 2516 for coupling to the circuit board 2502. In the embodiment illustrated in FIG. 35, the IC package 2520 and the circuit board 2502 are attached to opposing sides of the interposer 2504; in other embodiments, the IC package 2520 and the circuit board 2502 may be attached to a same side of the interposer 2504. In some embodiments, three or more components may be interconnected by way of the interposer 2504.

The interposer 2504 may be formed of an epoxy resin, a fiberglass-reinforced epoxy resin, a ceramic material, or a polymer material such as polyimide. In some implementations, the interposer 2504 may be formed of alternate rigid or flexible materials that may include the same materials described above for use in a semiconductor substrate, such as silicon, germanium, and other group III-V and group IV materials. The interposer 2504 may include metal interconnects 2508 and vias 2510, including but not limited to through-silicon vias (TSVs) 2506. The interposer 2504 may further include embedded devices 2514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 2504. The package-on-interposer structure 2536 may take the form of any of the package-on-interposer structures known in the art.

The IC device assembly 2500 may include an IC package 2524 coupled to the first face 2540 of the circuit board 2502 by coupling components 2522. The coupling components 2522 may take the form of any of the embodiments discussed above with reference to the coupling components 2516, and the IC package 2524 may take the form of any of the embodiments discussed above with reference to the IC package 2520.

The IC device assembly 2500 illustrated in FIG. 35 includes a package-on-package structure 2534 coupled to the second face 2542 of the circuit board 2502 by coupling components 2528. The package-on-package structure 2534 may include an IC package 2526 and an IC package 2532 coupled together by coupling components 2530 such that the IC package 2526 is disposed between the circuit board 2502 and the IC package 2532. The coupling components 2528 and 2530 may take the form of any of the embodiments of the coupling components 2516 discussed above, and the IC packages 2526 and 2532 may take the form of any of the embodiments of the IC package 2520 discussed above. The package-on-package structure 2534 may be configured in accordance with any of the package-on-package structures known in the art.

Figure 36:
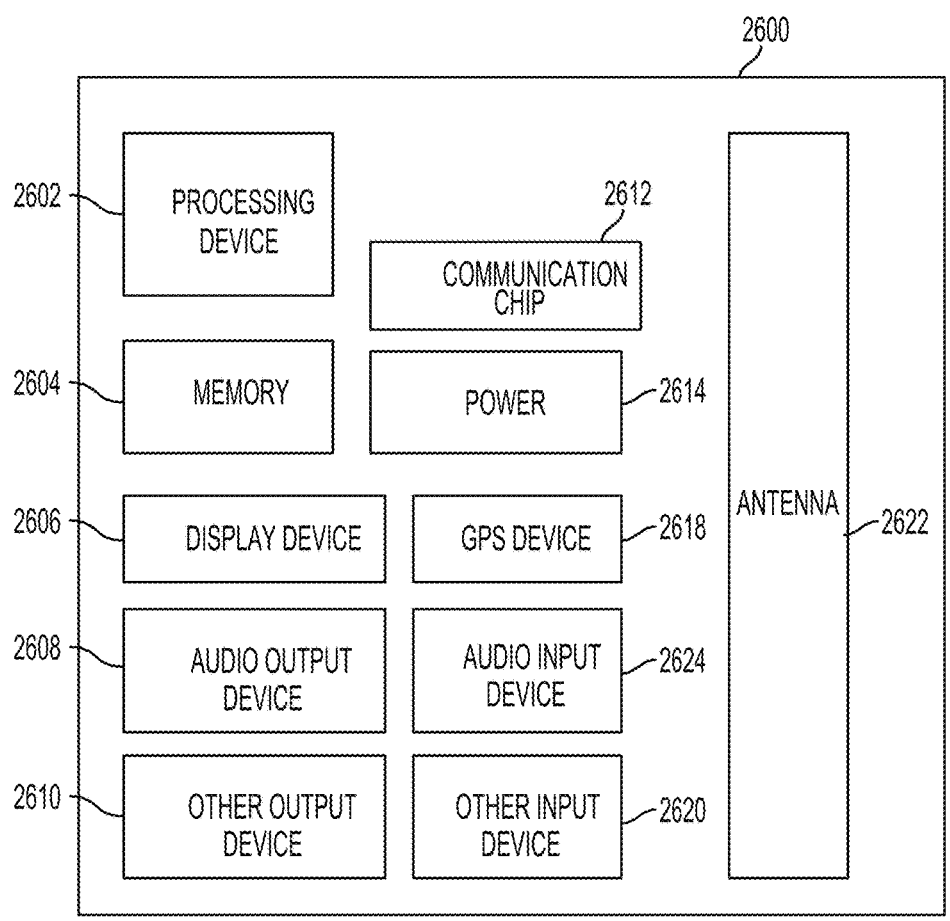
FIG. 36 is a block diagram of an example computing device that may include an interconnect in accordance with any of the embodiments disclosed herein.

FIG. 36 is a block diagram of an example computing device 2600 that may include one or more interconnects in accordance with the teachings of the present disclosure (e.g., any of the interconnects 100). A number of components are illustrated in FIG. 36 as included in the computing device 2600, but any one or more of these components may be omitted or duplicated, as suitable for the application. In some embodiments, some or all of the components included in the computing device 2600 may be attached to one or more motherboards. In some embodiments, some or all of these components are fabricated onto a single system-on-a-chip (SoC) die.

Additionally, in various embodiments, the computing device 2600 may not include one or more of the components illustrated in FIG. 36, but the computing device 2600 may include interface circuitry for coupling to the one or more components. For example, the computing device 2600 may not include a display device 2606, but may include display device interface circuitry (e.g., a connector and driver circuitry) to which a display device 2606 may be coupled. In another set of examples, the computing device 2600 may not include an audio input device 2624 or an audio output device 2608, but may include audio input or output device interface circuitry (e.g., connectors and supporting circuitry) to which an audio input device 2624 or audio output device 2608 may be coupled. Any one or more of the components of the computing device 2600 may be included in one or more IC devices that may include an embodiment of the interconnects disclosed herein.

The computing device 2600 may include a processing device 2602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2602 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2600 may include a memory 2604, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 2604 may include memory that shares a die with the processing device 2602. This memory may be used as cache memory and may include embedded dynamic random access memory (eDRAM) or spin-transfer torque MRAM (STT-MRAM). The processing device 2602 and/or the memory 2604 may include one or more of the interconnects disclosed herein.

In some embodiments, the computing device 2600 may include a communication chip 2612 (e.g., one or more communication chips). For example, the communication chip 2612 may be configured for managing wireless communications for the transfer of data to and from the computing device 2600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 2612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2612 may operate in accordance with other wireless protocols in other embodiments. The computing device 2600 may include an antenna 2622 to facilitate wireless communications and/or to receive other wireless communications (such as AM or FM radio transmissions).

In some embodiments, the communication chip 2612 may manage wired communications, such as electrical, optical, or any other suitable communication protocols (e.g., the Ethernet). As noted above, the communication chip 2612 may include multiple communication chips. For instance, a first communication chip 2612 may be dedicated to shorter-range wireless communications such as Wi-Fi or Bluetooth, and a second communication chip 2612 may be dedicated to longer-range wireless communications such as Global Positioning System (GPS), EDGE, GPRS, CDMA, WiMAX, LTE, EV-DO, or others. In some embodiments, a first communication chip 2612 may be dedicated to wireless communications, and a second communication chip 2612 may be dedicated to wired communications. The communication chip 2612 may include one or more of the interconnects disclosed herein.

The computing device 2600 may include battery/power circuitry 2614. The battery/power circuitry 2614 may include one or more energy storage devices (e.g., batteries or capacitors) and/or circuitry for coupling components of the computing device 2600 to an energy source separate from the computing device 2600 (e.g., AC line power).

The computing device 2600 may include a display device 2606 (or corresponding interface circuitry, as discussed above). The display device 2606 may include any visual indicators, such as a heads-up display, a computer monitor, a projector, a touchscreen display, a liquid crystal display (LCD), a light-emitting diode display, or a flat panel display, for example.

The computing device 2600 may include an audio output device 2608 (or corresponding interface circuitry, as discussed above). The audio output device 2608 may include any device that generates an audible indicator, such as speakers, headsets, or earbuds, for example.

The computing device 2600 may include an audio input device 2624 (or corresponding interface circuitry, as discussed above). The audio input device 2624 may include any device that generates a signal representative of a sound, such as microphones, microphone arrays, or digital instruments (e.g., instruments having a musical instrument digital interface (MIDI) output).

The computing device 2600 may include a GPS device 2618 (or corresponding interface circuitry, as discussed above). The GPS device 2618 may be in communication with a satellite-based system and may receive a location of the computing device 2600, as known in the art.

The computing device 2600 may include an other output device 2610 (or corresponding interface circuitry, as discussed above). Examples of the other output device 2610 may include an audio codec, a video codec, a printer, a wired or wireless transmitter for providing information to other devices, or an additional storage device.

The computing device 2600 may include an other input device 2620 (or corresponding interface circuitry, as discussed above). Examples of the other input device 2620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2600 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2600 may be any other electronic device that processes data.

The following paragraphs provide examples of various ones of the embodiments disclosed herein.

Example 1 is an integrated circuit (IC) device, including: an interconnect having a top surface and a bottom surface; wherein: the interconnect includes a first material and a second material, the second material is distributed in the first material, and a concentration of the second material is greater proximate to the top surface than proximate to the bottom surface.

Example 2 may include the subject matter of Example 1, and may further specify that the first material includes a metal.

Example 3 may include the subject matter of Example 2, and may further specify that the first material includes cobalt, copper, tungsten, aluminum, titanium, or ruthenium.

Example 4 may include the subject matter of any of Examples 1-3, and may further specify that the interconnect further includes a liner material at the bottom surface and side faces of the interconnect.

Example 5 may include the subject matter of any of Examples 1-4, and may further specify that the interconnect is a conductive via.

Example 6 may include the subject matter of any of Examples 1-4, and may further specify that the interconnect is a conductive line.

Example 7 may include the subject matter of any of Examples 1-6, and may further specify that the second material includes a metal.

Example 8 may include the subject matter of any of Examples 1-7, and may further specify that the second material includes a transition metal.

Example 9 may include the subject matter of any of Examples 1-8, and may further specify that the second material includes silicon, boron, or phosphorus.

Example 10 may include the subject matter of any of Examples 1-9, and may further specify that the second material is a dopant in the first material.

Example 11 may include the subject matter of any of Examples 1-10, and may further specify that the concentration of the second material decreases in a direction from the top surface to the bottom surface.

Example 12 may include the subject matter of any of Examples 1-11, and may further specify that the interconnect includes an intermetallic compound, and the intermetallic compound includes the second material.

Example 13 may include the subject matter of any of Examples 1-12, and may further specify that the interconnect has an anisotropic conductivity.

Example 14 is a method of manufacturing an integrated circuit (IC) interconnect, including: forming a trench in an insulating material; providing a first material in the trench; driving a second material into the first material to form a conductive fill; and planarizing a top surface of the conductive fill.

Example 15 may include the subject matter of Example 14, and may further specify that driving the second material into the first material includes doping the first material with the second material.

Example 16 may include the subject matter of Example 15, and may further specify that doping the first material with the second material includes diffusing the second material into the first material.

Example 17 may include the subject matter of Example 15, and may further specify that doping the first material with the second material includes performing ion implantation of the second material into the first material.

Example 18 may include the subject matter of Example 14 and may further specify that driving the second material into the first material includes: providing a thin film of the second material on the first material; and annealing the first material and the second material.

Example 19 may include the subject matter of Example 18, and may further specify that planarizing the top surface of the conductive fill includes removing the thin film of the second material.

Example 20 may include the subject matter of any of Examples 14-19, and may further specify that the first material includes a metal.

Example 21 may include the subject matter of any of Examples 14-20, and may further specify that the conductive fill includes a concentration gradient of the second material.

Example 22 is a method of manufacturing an integrated circuit (IC) interconnect, including: providing a first material; forming a conductive material by driving a second material into the first material; planarizing a top surface of the conductive material; and after planarizing, patterning the conductive material.

Example 23 may include the subject matter of Example 22, and may further specify that patterning the conductive material includes subtractive patterning of at least one conductive line.

Example 24 may include the subject matter of any of Examples 22-23, and may further include, prior to providing the first material, providing a conformal liner material.

Example 25 may include the subject matter of any of Examples 22-24, and may further specify that the conductive material includes at least one conductive via.

Example 26 is a computing device, including: a plurality of transistors in a device layer;
a plurality of contacts; and an interconnect in an electrical pathway between at least one transistor and at least one contact; wherein: the interconnect includes a first material and a second material distributed in the first material, the interconnect includes a first surface and a second surface, and the second surface is between the first surface and the plurality of transistors, and a concentration of the second material in the first material decreases in a direction from the first surface to the second surface.

Example 27 may include the subject matter of Example 26, and may further specify that the plurality of transistors, plurality of contacts, and interconnect are included in a die.

Example 28 may include the subject matter of any of Examples 26-27, and may further specify that the plurality of transistors, plurality of contacts, and interconnect are included in a memory device.

Example 29 may include the subject matter of any of Examples 26-28, and may further specify that the plurality of transistors, plurality of contacts, and interconnect are included in a processing device.

The invention claimed is:

1. An integrated circuit (IC) device, comprising:
an interconnect having a top surface and a bottom surface;
wherein:
the interconnect includes a first material and a second material, wherein the first material includes a metal and the second material includes boron or phosphorus,
the second material is distributed in the first material, and
a concentration of the second material is greater proximate to the top surface than proximate to the bottom surface.

2. The IC device of claim 1, wherein the first material includes cobalt, copper, tungsten, aluminum, titanium, or ruthenium.

3. The IC device of claim 1, wherein the interconnect further includes:
a liner material at the bottom surface and side faces of the interconnect.

4. The IC device of claim 1, wherein the interconnect is a conductive via.

5. The IC device of claim 1, wherein the interconnect is a conductive line.

6. The IC device of claim 1, wherein the second material is a dopant in the first material.

7. The IC device of claim 1, wherein the concentration of the second material monotonically decreases in a direction from the top surface to the bottom surface.

8. The IC device of claim 1, wherein the interconnect includes an intermetallic compound, and the intermetallic compound includes the second material.

9. The IC device of claim 1, wherein the interconnect has an anisotropic conductivity.

10. The IC device of claim 1, wherein the interconnect has a small grain microstructure near the top surface.

11. The IC device of claim 1, wherein the second material is located along grain boundaries of the first material.

12. A method of manufacturing an integrated circuit (IC) interconnect, comprising:
forming a trench in an insulating material;
providing a first material in the trench, wherein the first material includes a metal;
providing a second material into the first material to form a conductive fill, wherein the second material includes boron or phosphorus; and
planarizing a top surface of the conductive fill, wherein a concentration of the second material is greater proximate to the top surface of the conductive fill than proximate to a bottom surface of the conductive fill.

13. The method of claim 12, wherein providing the second material into the first material includes performing ion implantation of the second material into the first material.

14. A computing device, comprising:
a plurality of transistors in a device layer;
a plurality of contacts; and
an interconnect in an electrical pathway between at least one transistor and at least one contact;
wherein:
the interconnect includes a first material and a second material distributed in the first material, wherein the first material includes a metal and the second material includes boron or phosphorus,
the interconnect includes a first surface and a second surface, and the second surface is between the first surface and the plurality of transistors, and
a concentration of the second material in the first material decreases substantially monotonically from the first surface to the second surface.

15. The computing device of claim 14, wherein the plurality of transistors, plurality of contacts, and interconnect are included in a memory device.

16. The computing device of claim 14, wherein the plurality of transistors, plurality of contacts, and interconnect are included in a processing device.

17. The computing device of claim 14, wherein the plurality of transistors, plurality of contacts, and interconnect are included in a die.

18. The computing device of claim 14, wherein the interconnect has a small grain microstructure near the first surface.

19. The computing device of claim 14, wherein the second material is located along grain boundaries of the first material.

* * * * *

UNITED STATES PATENT AND TRADEMARK OFFICE
CERTIFICATE OF CORRECTION

PATENT NO. : 11,018,054 B2
APPLICATION NO. : 16/486612
DATED : May 25, 2021
INVENTOR(S) : Daniel J. Zierath et al.

It is certified that error appears in the above-identified patent and that said Letters Patent is hereby corrected as shown below:

On the Title Page

Column 2, in the item (56) "OTHER PUBLICATIONS", Line 2, delete "Thin Solind Films" and insert -- Thin Solid Films --, therefor.

Signed and Sealed this
Third Day of August, 2021

Drew Hirshfeld
*Performing the Functions and Duties of the
Under Secretary of Commerce for Intellectual Property and
Director of the United States Patent and Trademark Office*